(12) United States Patent
Young et al.

(10) Patent No.: US 11,664,420 B2
(45) Date of Patent: May 30, 2023

(54) SEMICONDUCTOR DEVICE AND METHOD

(71) Applicant: Taiwan Semiconductor Manufacturing Co., Ltd., Hsinchu (TW)

(72) Inventors: Bo-Feng Young, Taipei (TW); Sai-Hooi Yeong, Zhubei (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 81 days.

(21) Appl. No.: 16/806,366

(22) Filed: Mar. 2, 2020

(65) Prior Publication Data

US 2021/0202697 A1 Jul. 1, 2021

Related U.S. Application Data

(60) Provisional application No. 62/953,824, filed on Dec. 26, 2019.

(51) Int. Cl.
*H01L 29/06* (2006.01)
*H01L 21/02* (2006.01)
(Continued)

(52) U.S. Cl.
CPC .... *H01L 29/0673* (2013.01); *H01L 21/02532* (2013.01); *H01L 21/26513* (2013.01);
(Continued)

(58) Field of Classification Search
CPC .......... H01L 29/0673; H01L 21/02532; H01L 21/3065; H01L 21/76224;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

DE 102017119616 A1 11/2018
KR 20150130269 A 11/2015
(Continued)

*Primary Examiner* — Bac H Au
(74) *Attorney, Agent, or Firm* — Slater Matsil, LLP

(57) ABSTRACT

An embodiment is a semiconductor device including a first channel region over a semiconductor substrate, a second channel region over the first channel region, a first gate stack over the semiconductor substrate and surrounding the first channel region and the second channel region, a first inner spacer extending from the first channel region to the second channel region and along a sidewall of the first gate stack, a second inner spacer extending from the first channel region to the second channel region and along a sidewall of the first inner spacer, the second inner spacer having a different material composition than the first inner spacer, and a first source/drain region adjacent the first channel region, the second channel region, and the second inner spacer, the first and second inner spacers being between the first gate stack and the first source/drain region.

20 Claims, 30 Drawing Sheets

(51) Int. Cl.
*H01L 21/265* (2006.01)
*H01L 21/3065* (2006.01)
*H01L 21/762* (2006.01)
*H01L 21/8238* (2006.01)
*H01L 27/092* (2006.01)
*H01L 29/08* (2006.01)
*H01L 29/10* (2006.01)
*H01L 29/66* (2006.01)

(52) U.S. Cl.
CPC .... *H01L 21/3065* (2013.01); *H01L 21/76224* (2013.01); *H01L 21/823807* (2013.01); *H01L 21/823814* (2013.01); *H01L 21/823821* (2013.01); *H01L 21/823828* (2013.01); *H01L 21/823878* (2013.01); *H01L 27/0924* (2013.01); *H01L 29/0847* (2013.01); *H01L 29/1037* (2013.01); *H01L 29/6656* (2013.01); *H01L 29/66545* (2013.01); *H01L 29/66553* (2013.01); *H01L 29/66795* (2013.01)

(58) Field of Classification Search
CPC ..... H01L 21/823807; H01L 21/823814; H01L 21/823821; H01L 21/823828; H01L 21/823878; H01L 27/0924; H01L 29/0847; H01L 29/1037; H01L 29/66545; H01L 29/66553; H01L 29/6656; H01L 29/66795; H01L 29/42392
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,475,902 B2* | 11/2019 | Lee | H01L 27/092 |
| 10,573,564 B2 | 2/2020 | Mosden et al. | |
| 10,825,915 B2* | 11/2020 | Lee | H01L 29/6656 |
| 10,923,598 B2* | 2/2021 | Wang | H01L 29/66742 |
| 11,164,941 B2* | 11/2021 | Zhang | H01L 21/823412 |
| 2016/0240681 A1 | 8/2016 | Ching et al. | |
| 2018/0047834 A1 | 2/2018 | Chao et al. | |
| 2018/0342596 A1* | 11/2018 | Lee | H01L 29/42392 |
| 2019/0006485 A1 | 1/2019 | Kim et al. | |
| 2019/0067122 A1 | 2/2019 | Cheng et al. | |
| 2019/0067441 A1 | 2/2019 | Yang et al. | |
| 2019/0081155 A1 | 3/2019 | Xie et al. | |
| 2019/0198639 A1 | 6/2019 | Kim et al. | |
| 2019/0371888 A1* | 12/2019 | Zhang | H01L 29/775 |
| 2020/0075743 A1 | 3/2020 | Lee et al. | |
| 2020/0357931 A1* | 11/2020 | Lee | H01L 29/775 |
| 2020/0373300 A1* | 11/2020 | Zhang | H01L 21/28088 |
| 2020/0402984 A1* | 12/2020 | Reznicek | H01L 29/66545 |
| 2021/0217848 A1* | 7/2021 | Kim | H01L 29/1029 |
| 2021/0242327 A1* | 8/2021 | Lin | H01L 29/66553 |
| 2021/0273096 A1* | 9/2021 | Yang | H01L 21/823807 |
| 2021/0376101 A1* | 12/2021 | Wang | H01L 27/0886 |

FOREIGN PATENT DOCUMENTS

| | | |
|---|---|---|
| KR | 20160099445 A | 8/2016 |
| KR | 20190024625 A | 3/2019 |
| KR | 20190078818 A | 7/2019 |
| WO | 2014142952 A1 | 9/2014 |
| WO | 2018201066 A1 | 11/2018 |

* cited by examiner

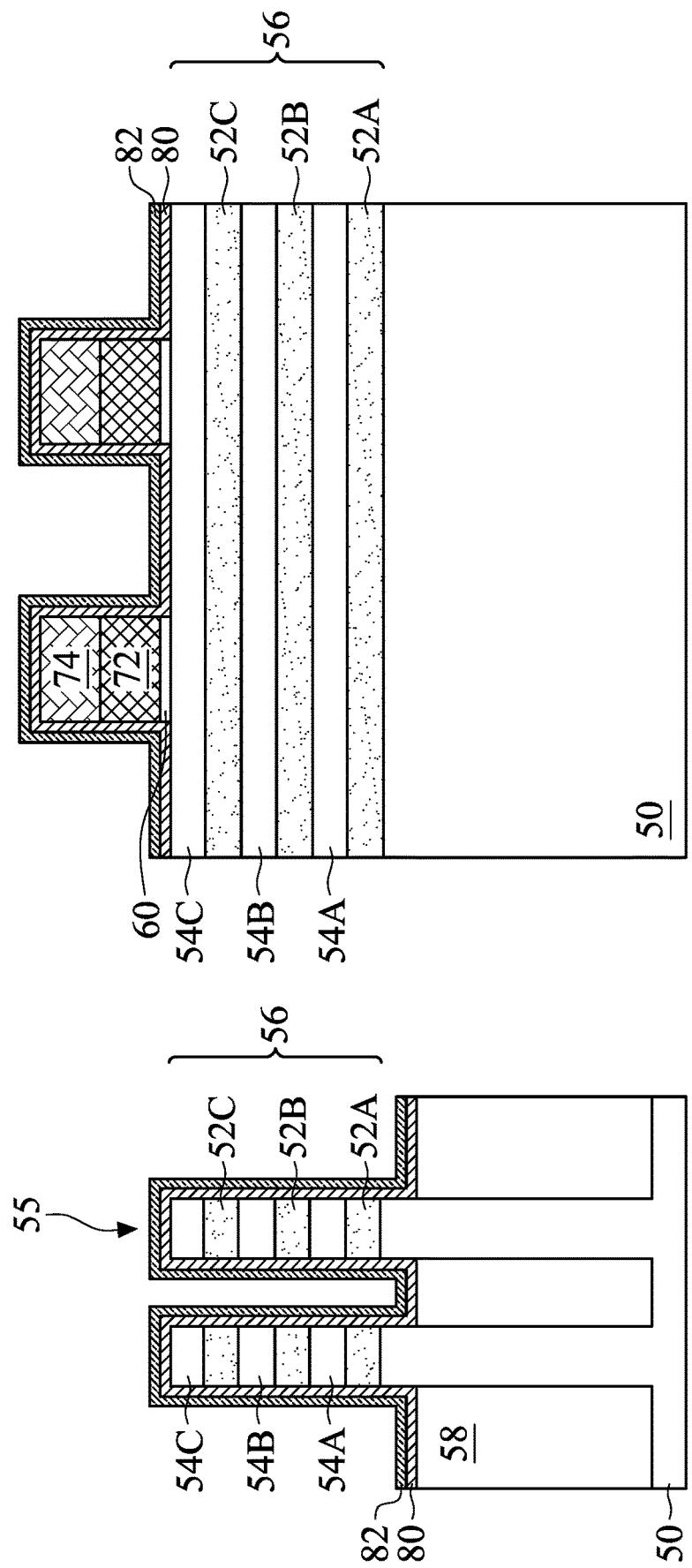

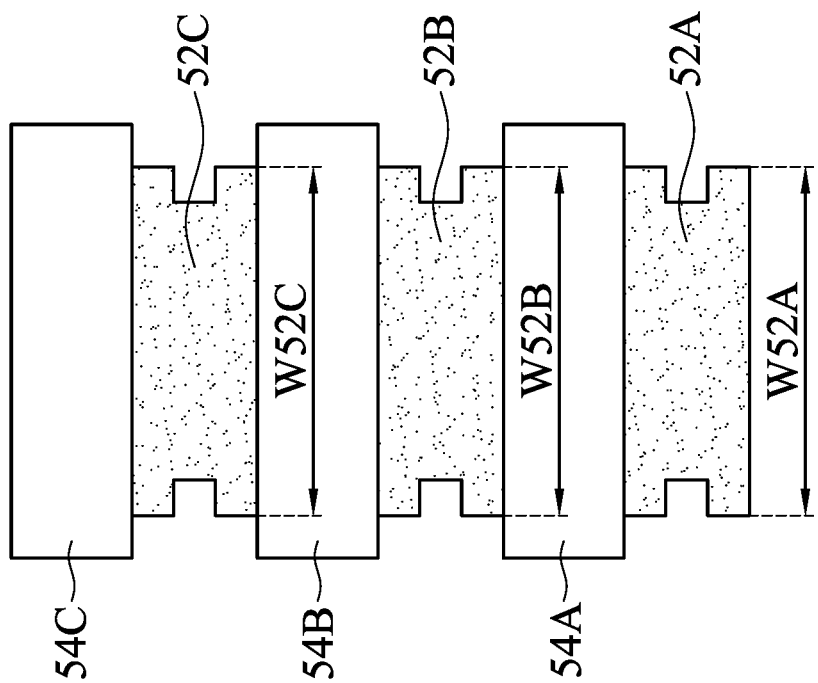
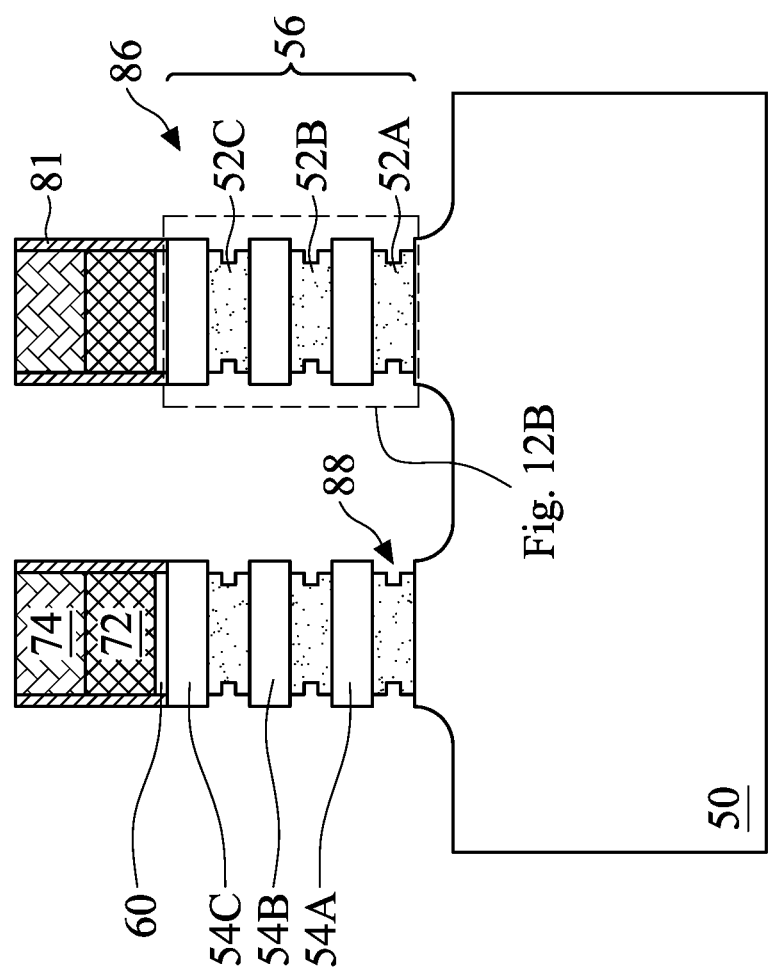
Figure 12A
Figure 12B

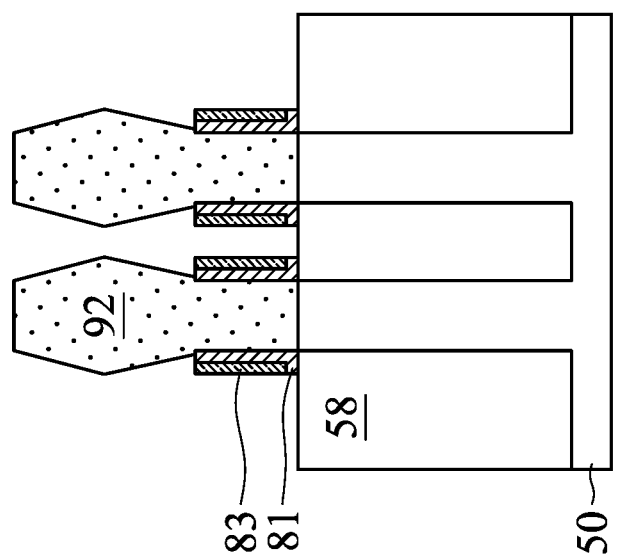

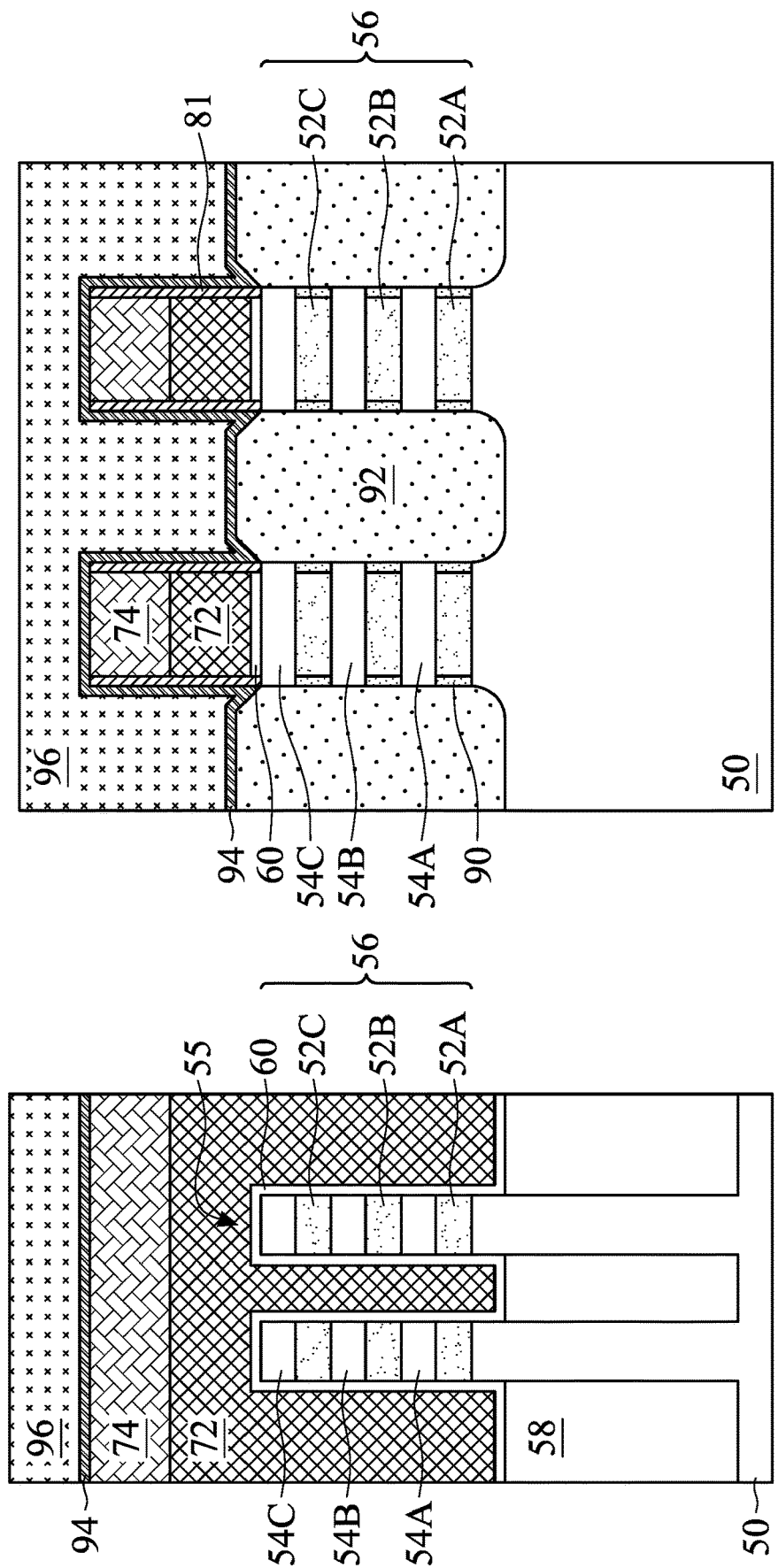

SEMICONDUCTOR DEVICE AND METHOD

CROSS-REFERENCE TO RELATED APPLICATIONS

This application claims the benefit of U.S. Provisional Application No. 62/953,824, filed on Dec. 26, 2019, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 8C, 9A, 9B, 10A, 10B, 10C, 11A, 11B, 12A, 12B, 13A, 13B, 14A, 14B, 15A, 15B, 15C, 16A, 16B, 17A, 17B, 18A, 18B, 19A, 19B, 20A, 20B, 21A, 21B, 22A, and 22B are cross-sectional views of intermediate stages in the manufacturing of semiconductor devices, in accordance with some embodiments.

DETAILED DESCRIPTION

Figure 1:
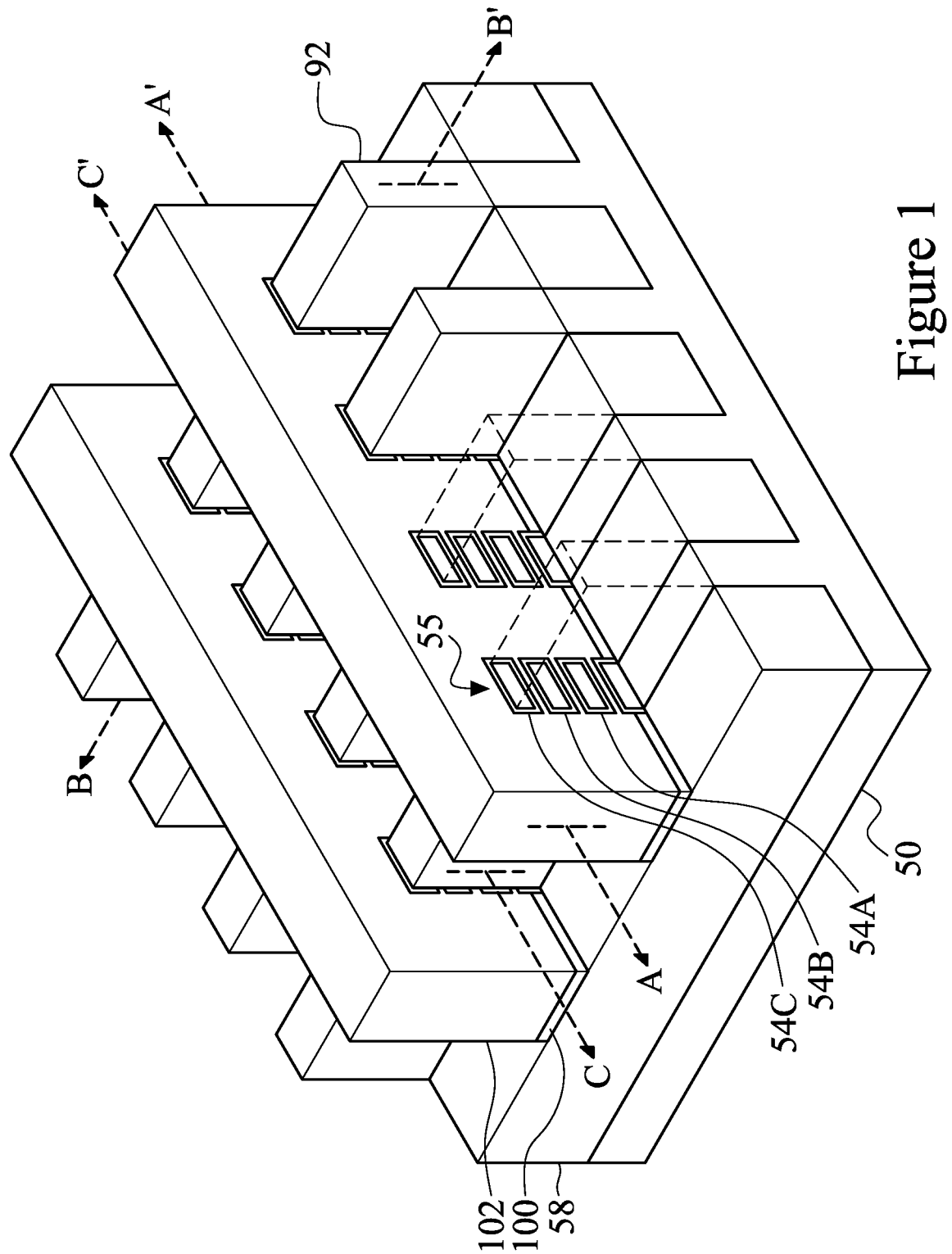
FIG. 1 illustrates an example of a semiconductor device including nanostructure field-effect transistors (NSFETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide semiconductor devices and methods of forming the same in which nanostructures are designed to control the shapes and dimensions of the replacement gate and inner spacer structures. In specific embodiments, the atomic concentration of an element (e.g., Ge) in a semiconductor compound of a sacrificial layer may controlled and varied to control the shape and dimensions of the replacement gate structure. Further, the atomic concentration of an element (e.g., Ge) in a semiconductor compound of a sacrificial layer may controlled and varied to control the length of the channel region of the nanostructure device. By controlling the shape and dimensions of the replacement gate structure and channel length, the electrical properties of the nanostructure device can be improved, and the uniformity of the nanostructure device can be improved. In further embodiments, the inner spacer structure may include multiple spacer layers which can improve the etching resistance of the inner spacer structure while also lowering the capacitance for the nanostructure device.

FIG. 1 illustrates an example of nanostructure (e.g., nanosheet, nanowire, gate-all-around, or the like) field effect transistors (NSFETs), in accordance with some embodiments. The NSFETs comprise nanostructures 55 over a substrate 50 (e.g., a semiconductor substrate). The nanostructures 55 include second semiconductor layers 54A-54C, which act as channel regions of the nanostructures 55. Shallow trench isolation (STI) regions 58 are disposed in the substrate 50, and the nanostructures 55 are disposed above and between neighboring STI regions 58. Although the STI regions 58 are described/illustrated as being separate from the substrate 50, as used herein, the term "substrate" may refer to the semiconductor substrate alone or a combination of the semiconductor substrate and the STI regions.

Gate dielectric layers 100 are along top surfaces, sidewalls, and bottom surfaces of the nanostructures 55, such as on top surfaces, sidewalls, and bottom surfaces of each of the second semiconductor layers 54A-54C, and along top surfaces and sidewalls of portions of the substrate 50. Gate electrodes 102 are over the gate dielectric layers 100. Epitaxial source/drain regions 92 are disposed on opposite sides of the nanostructures 55, the gate dielectric layers 100, and the gate electrodes 102. FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of the NSFETs. Cross-section B-B' is perpendicular to cross-section A-A' and is along a longitudinal axis of a nanostructure 55 and in a direction of, for example, the current flow between the epitaxial source/drain regions 92 of the NSFETs. Cross-section C-C' is parallel to cross-section A-A' and extends through the epitaxial source/drain regions 92 of the NSFETs. Subsequent figures refer to these reference cross-sections for clarity.

Some embodiments discussed herein are discussed in the context of NSFETs formed using gate-last processes. In other embodiments, a gate-first process may be used. Also, some embodiments contemplate aspects used in fin field effect transistors (FinFETs) or planar devices, such as planar FETs.

FIGS. 2 through 22B are cross-sectional views of intermediate stages in the manufacturing of NSFETs, in accordance with some embodiments. FIGS. 2 through 5, 6A, 16A, 17A, 18A, 19A, 20A, 21A, and 22A illustrate reference cross-section A-A' illustrated in FIG. 1. FIGS. 6B, 7B, 8B, 8C, 9B, 10B, 11A, 12A, 13A, 14B, 15B, 16B, 17B, 18B, 19B, 20B, 21B, and 22B illustrate reference cross-section B-B' illustrated in FIG. 1. FIGS. 7A, 8A, 9A, 10A, 14A, 15A, and 15C illustrate reference cross-section C-C' illustrated in FIG. 1.

Figure 2:
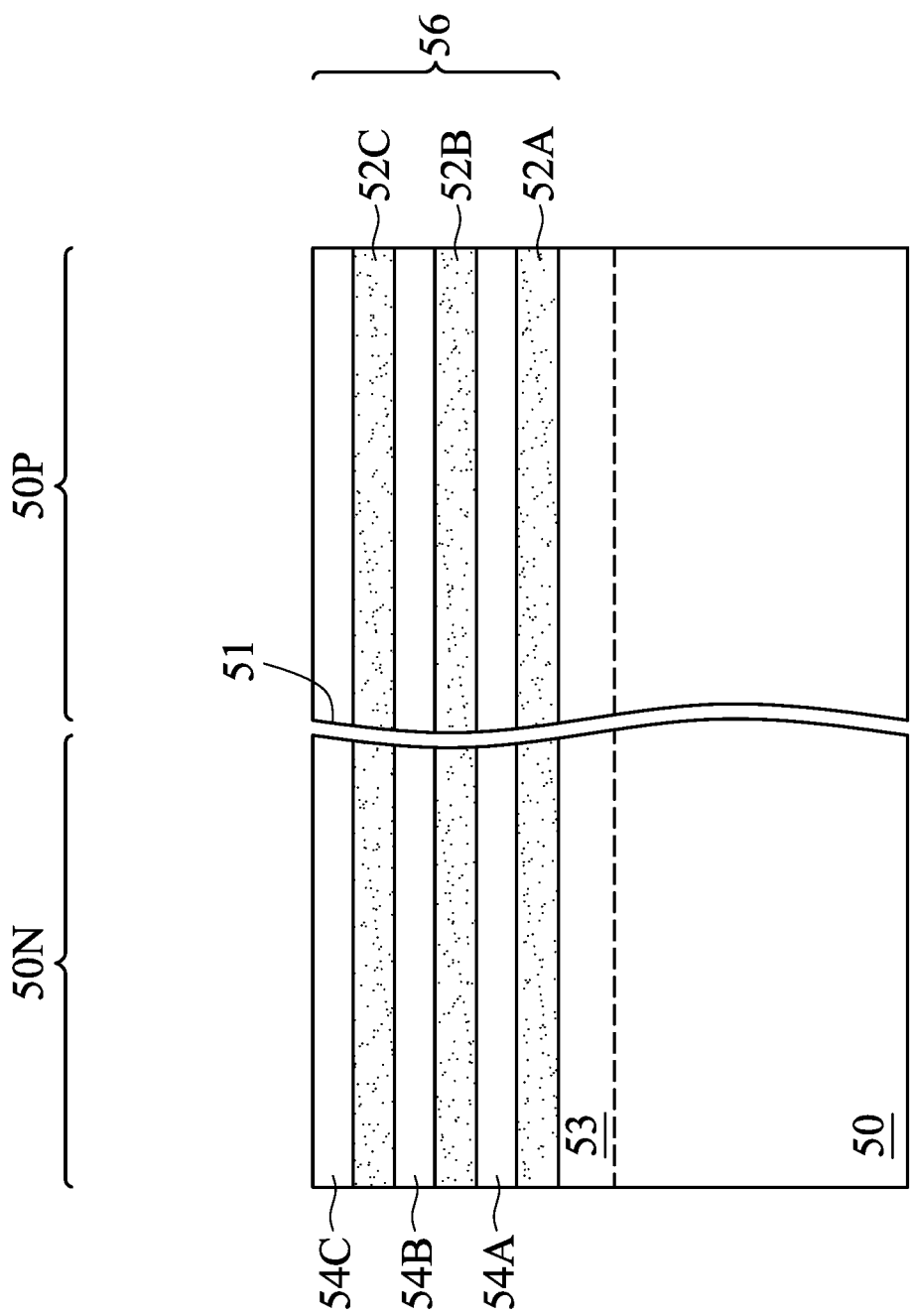

In FIG. 2, a substrate 50 is provided for forming NSFETs. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type NSFETs. The region 50P can be for forming p-type devices, such as PMOS transistors, e.g., p-type NSFETs. The region 50N may be physically separated from the region 50P (as illustrated by divider 51), and any number of device features (e.g., other active devices, doped regions, isolation structures, etc.) may be disposed between the region 50N and the region 50P.

The substrate 50 may be lightly doped with a p-type or an n-type impurity. An anti-punch-through (APT) implantation may be performed on an upper portion of the substrate 50 to form an APT region 53. During the APT implantation, dopants may be implanted in the region 50N and the region 50P. The dopants may have a conductivity type opposite a conductivity type of source/drain regions (such as the epitaxial source/drain regions 92, discussed below with respect to FIGS. 15A-15C 12A 12C) to be formed in each of the region 50N and the region 50P. The APT region 53 may extend under the subsequently formed source/drain regions in the resulting NSFETs, which will be formed in subsequent processes. The APT region 53 may be used to reduce the leakage from the source/drain regions to the substrate 50. In some embodiments, the doping concentration in APT region 53 may be from about 1×1018 atoms/cm3 to about 1×1019 atoms/cm3, such as about 5.5×1018 atoms/cm3. For simplicity and legibility, the APT region 53 is not illustrated in subsequent drawings.

Further in FIG. 2, a multi-layer stack 56 is formed over the substrate 50. The multi-layer stack 56 includes alternating first semiconductor layers 52 and second semiconductor layers 54 of different semiconductor materials. The first semiconductor layers 52 may be formed of first semiconductor materials, which may include, for example, silicon germanium (SiGe) or the like. The second semiconductor layers 54 may be formed of second semiconductor materials, which may include, for example, silicon (Si), silicon carbide (SiC), or the like. In other embodiments, the first semiconductor layers 52 may be formed of the second semiconductor materials and the second semiconductor layers 54 may be formed of the first semiconductor materials. For purposes of illustration, the multi-layer stack 56 includes three of the first semiconductor layers 52 (e.g., first semiconductor layers 52A-52C) and three of the second semiconductor layers 54 (e.g., second semiconductor layers 54A-54C). In other embodiments, the multi-layer stack 56 may include any number of the first semiconductor layers 52 and the second semiconductor layers 54. Each of the layers of the multi-layer stack 56 may be epitaxially grown using a process such as chemical vapor deposition (CVD), atomic layer deposition (ALD), vapor phase epitaxy (VPE), molecular beam epitaxy (MBE), or the like.

In some embodiments, the first semiconductor layers 52 have varied compositions. For example, the atomic concentration of germanium in the first semiconductor layers 52 can be varied. As an example, the flow rates of the precursors used to epitaxially grow the first semiconductor layers 52 can be varied to achieve the first semiconductor layers 52 with different compositions. By varying the atomic concentration of germanium in the first semiconductor layers 52, the etching rate of the first semiconductor layers 52 can be different to allow each of the first semiconductor layers to have the same length between subsequently formed source/drain regions. In some embodiments, the atomic concentration of germanium can decrease moving from the bottom first semiconductor layer 52A to the top first semiconductor layer 52C. For example, the atomic concentration of germanium in the bottom first semiconductor layer 52A can range from about 30% to about 40%, such as about 35%, the atomic concentration of germanium in the middle first semiconductor layer 52B can range from about 25% to about 35%, such as about 30%, and the atomic concentration of germanium in the top first semiconductor layer 52C can range from about 20% to about 30%, such as about 25%. By increasing the amount of germanium in the lower layers of the first semiconductor layers 52, the etch rate for those lower layers can be greater than the upper layers of the first semiconductor layers 52 such that the lower layers 52 can etch the same amount as the upper layers 52 even though the upper layers 52 are exposed to the etch process for a longer time. In some embodiments, each of the first semiconductor layers 52 has a different atomic concentration of germanium relative to the other first semiconductor layers 52 but has a same atomic concentration throughout the entirety of that first semiconductor layer.

For purposes of illustration, the second semiconductor layers 54 will be described as forming channel regions in completed NSFET devices. The first semiconductor layers 52 may be sacrificial layers, which may be subsequently removed. Nevertheless, in some embodiments the second semiconductor layers 54A-54C may form channel regions in completed NSFET devices, while the first semiconductor layers 52A-52D may be sacrificial layers.

Figure 3:
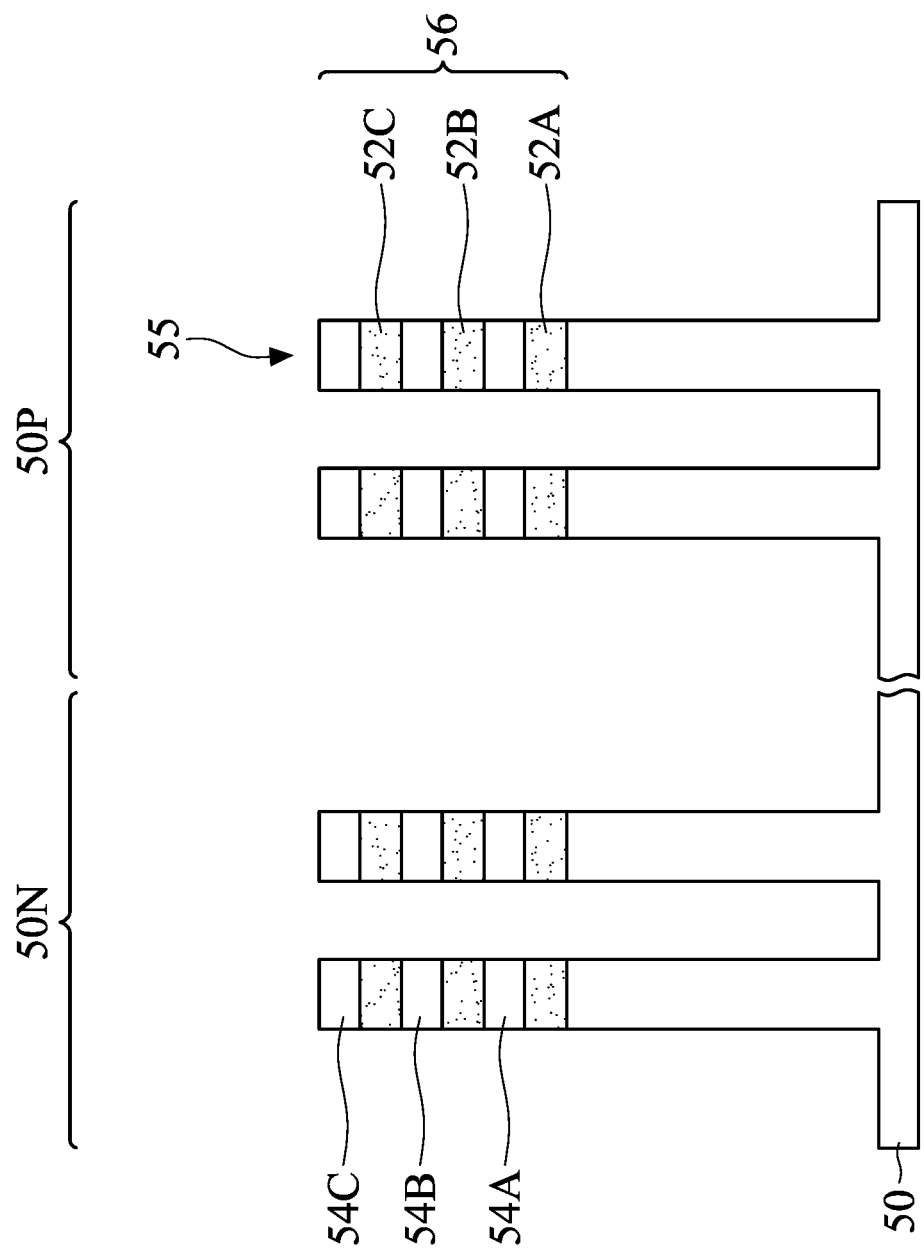

In FIG. 3, nanostructures 55 are formed in the multi-layer stack 56 and the substrate 50 is etched. In some embodiments, the nanostructures 55 (sometimes referred to as multi-layer fin structures 55) may be formed by etching trenches in the multi-layer stack 56 and the substrate 50. The etching may be any acceptable etch process, such as a reactive ion etch (RIE), neutral beam etch (NBE), the like, or a combination thereof. The etching may be anisotropic.

The nanostructures 55 and the substrate 50 may be patterned by any suitable method. For example, the nanostructures 55 and the substrate 50 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures 55 and the substrate 50. In some embodiments, a mask (or other layer) may remain on the nanostructures 55 after patterning the nanostructures 55 and the substrate 50.

Figure 4:
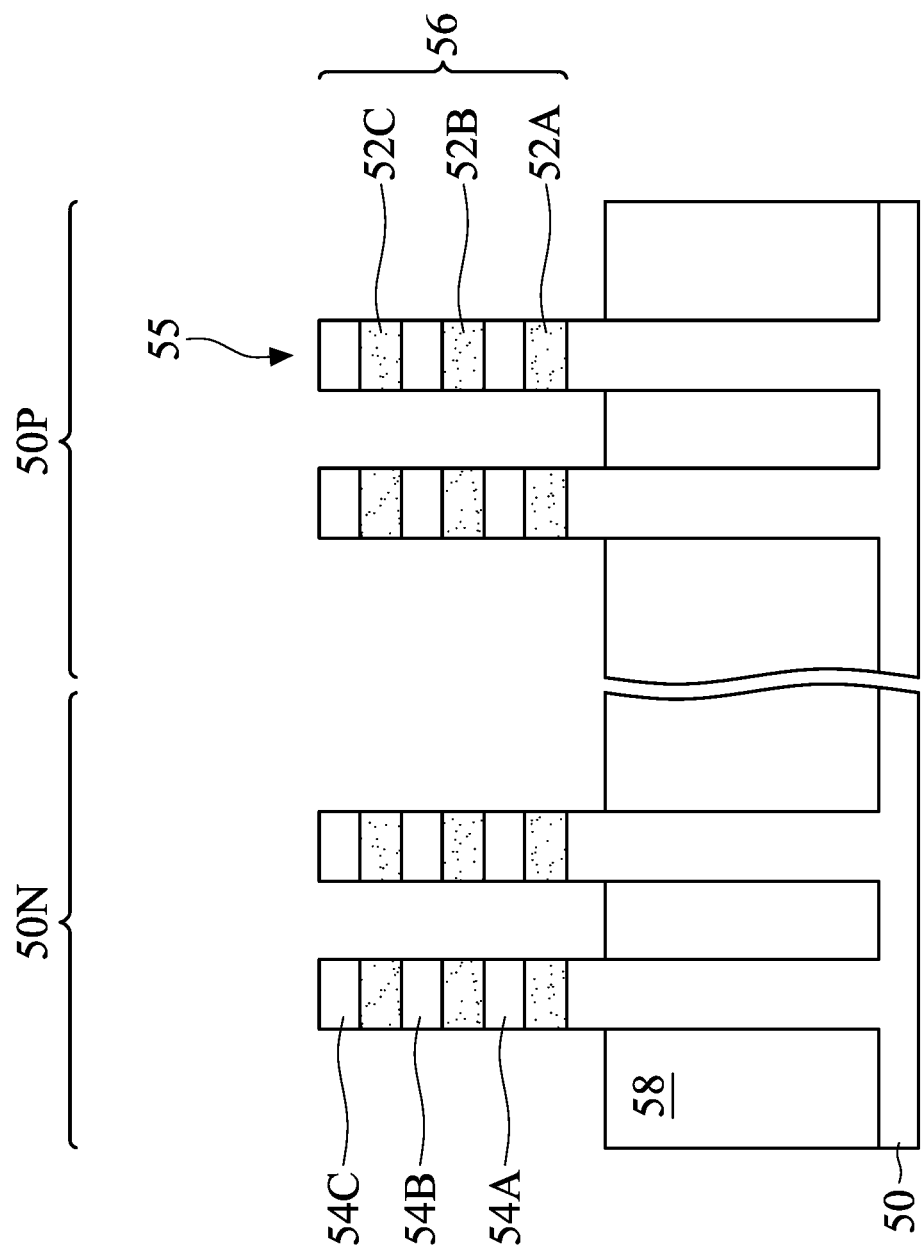

In FIG. 4, shallow trench isolation (STI) regions 58 are formed adjacent the nanostructures 55 and the patterned portions of the substrate 50. The STI regions 58 may be formed by forming an insulation material (not separately illustrated) over the substrate 50 and between neighboring nanostructures 55/patterned portions of the substrate 50. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. The insulation material may comprise a single layer or may utilize multiple layers. For example, in some embodiments a liner (not separately illustrated) may first be formed along surfaces of the substrate 50 and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process may planarize the insulation material and the nanostructures 55. The planarization process exposes the nanostructures 55 such that top surfaces of the nanostructures 55 and the insulation material are level after the planarization process is complete.

The insulation material is then recessed to form the STI regions 58 as illustrated in FIG. 4. The insulation material is recessed such that upper portions of the nanostructures 55 and the substrate 50 protrude from between neighboring STI regions 58. Further, the top surfaces of the STI regions 58 may have flat surfaces as illustrated, convex surfaces, concave surfaces (such as dishing), or a combination thereof. The top surfaces of the STI regions 58 may be formed flat, convex, and/or concave by an appropriate etch. The STI regions 58 may be recessed using an acceptable etching process, such as one that is selective to the material of the insulation material (e.g., etches the material of the insulation material at a faster rate than the material of the nanostructures 55 and the substrate 50). For example, an oxide removal using, for example, dilute hydrofluoric (dHF) acid may be used.

The process described with respect to FIGS. 2-4 is just one example of how the nanostructures 55 may be formed. In some embodiments, the nanostructures 55 may be formed by epitaxial growth processes. For example, dielectric layers may be formed over top surfaces of the substrate 50, and trenches may be etched through the dielectric layers to expose the underlying substrate 50. Epitaxial structures may be epitaxially grown in the trenches, and the dielectric layers may be recessed such that the epitaxial structures protrude from the dielectric layer to form the nanostructures 55. In the nanostructures 55, the epitaxial structures may comprise alternating layers of the first semiconductor materials and the second semiconductor materials. The substrate 50 may include epitaxial structures, which may be homoepitaxial structures or heteroepitaxial structures. The dielectric layers may be subsequently recessed such that the nanostructures 55 and portions of the substrate 50 protrude from the dielectric layer. In embodiments where the nanostructures 55 and portions of the substrate 50 are epitaxially grown, the epitaxially grown materials may be in situ doped during growth, which may obviate prior and subsequent implantations, although in situ and implantation doping may be used together.

Still further, it may be advantageous to epitaxially grow material in the region 50N (e.g., the NMOS region) different from the materials in the region 50P (e.g., the PMOS region). In various embodiments, upper portions of the substrate 50 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 4, appropriate wells (not separately illustrated) may be formed in the nanostructures 55 and/or the substrate 50. In some embodiments, P wells may be formed in the region 50N, and N wells may be formed in the region 50P. In further embodiments, P wells or N wells may be formed in each of the region 50N and the region 50P.

In embodiments including different well types, different implant steps for the region 50N and the region 50P may be achieved using a photoresist or other masks (not separately illustrated). For example, a photoresist may be formed over the nanostructures 55, the substrate 50, and the STI regions 58 in the region 50N. The photoresist is patterned to expose the region 50P of the substrate 50. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N. The n-type impurities may be phosphorus, arsenic, antimony, or the like implanted in the region to a concentration of equal to or less than $1\times10^{18}$ atoms/cm$^3$, such as from about 1×10$^{16}$ atoms/cm$^3$ to about 1×10$^{18}$ atoms/cm$^3$, or about 5.05×10$^{17}$ atoms/cm$^3$. After the implant, the photoresist is removed, such as by an acceptable ashing process.

Following the implanting of the region 50P, a photoresist is formed over the nanostructures 55, the substrate 50, and the STI regions 58 in the region 50P. The photoresist is patterned to expose the region 50N of the substrate 50. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P. The p-type impurities may be boron, boron fluoride, indium, or the like implanted in the region to a concentration of equal to or less than 1×10$^{18}$ atoms/cm$^3$, such as from about 1×10$^{16}$ atoms/cm$^3$ to about 1×10$^{18}$ atoms/cm$^3$, or about 5.05×10$^{17}$ atoms/cm$^3$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
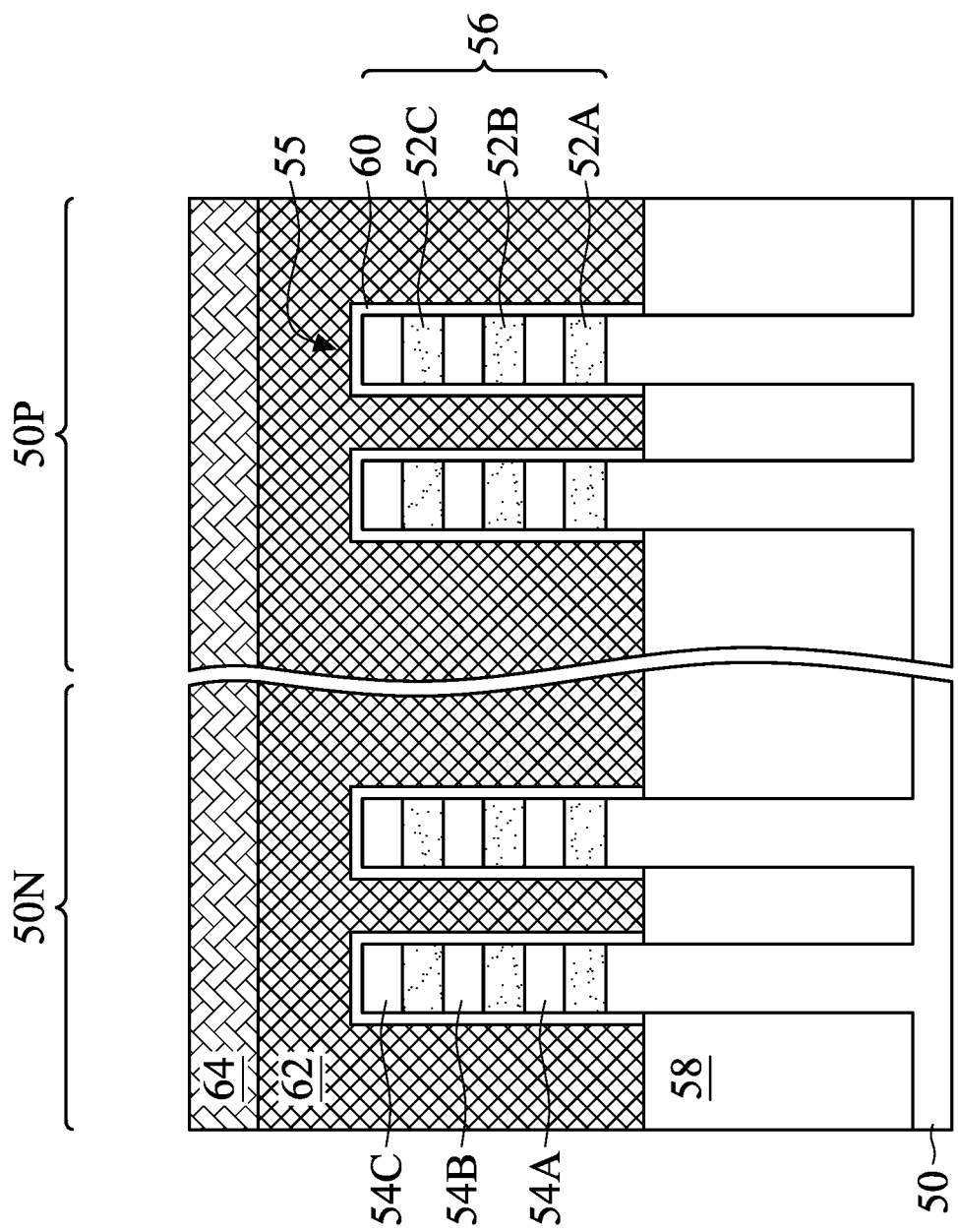

In FIG. 5, dummy dielectric layers 60 are formed on the nanostructures 55 and the substrate 50. The dummy dielectric layers 60 may be, for example, silicon oxide (SiO), silicon nitride (SiN), a combination thereof, or the like, and may be deposited or thermally grown according to acceptable techniques. A dummy gate layer 62 is formed over the dummy dielectric layers 60, and a mask layer 64 is formed over the dummy gate layer 62. The dummy gate layer 62 may be deposited over the dummy dielectric layers 60 and then planarized by a process such as CMP. The mask layer 64 may be deposited over the dummy gate layer 62. The dummy gate layer 62 may be conductive or non-conductive materials and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the material of the STI regions 58. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layers 60 are shown covering only the nanostructures 55 and the substrate 50 for illustrative purposes only. In some embodiments, the dummy dielectric layers 60 may be deposited such that the dummy dielectric layers 60 cover the STI regions 58, extending between the dummy gate layer 62 and the STI regions 58.

FIGS. 6A through 19B illustrate various additional steps in the manufacturing of embodiment devices. FIGS. 6B through 19B illustrate features in either of the region 50N or the region 50P. For example, the structures illustrated in FIGS. 6B through 19B may be applicable to both the region 50N and the region 50P. Differences (if any) in the structures of the region 50N and the region 50P are described in the text accompanying each figure.

Figure 6A:
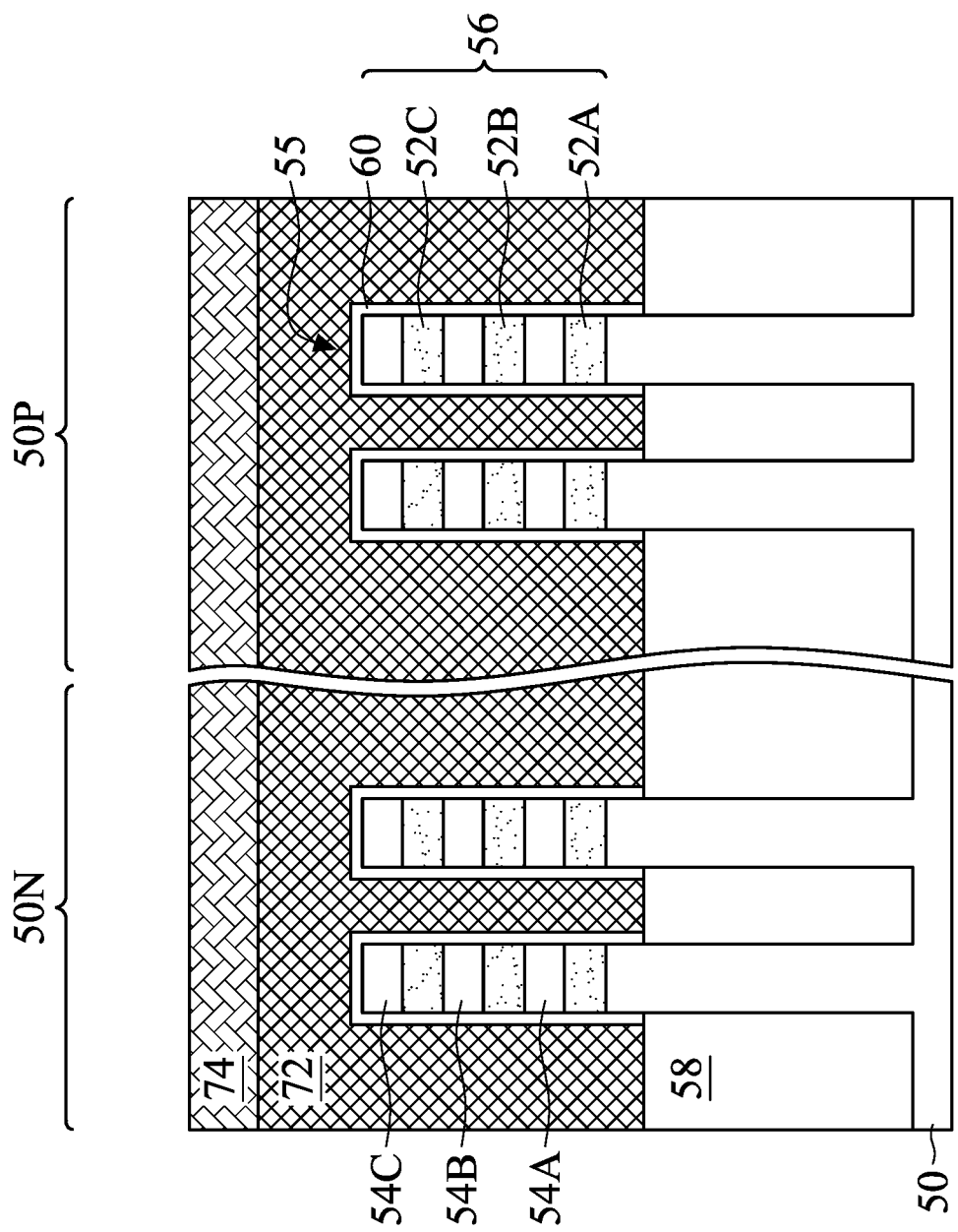
Figure 6B:
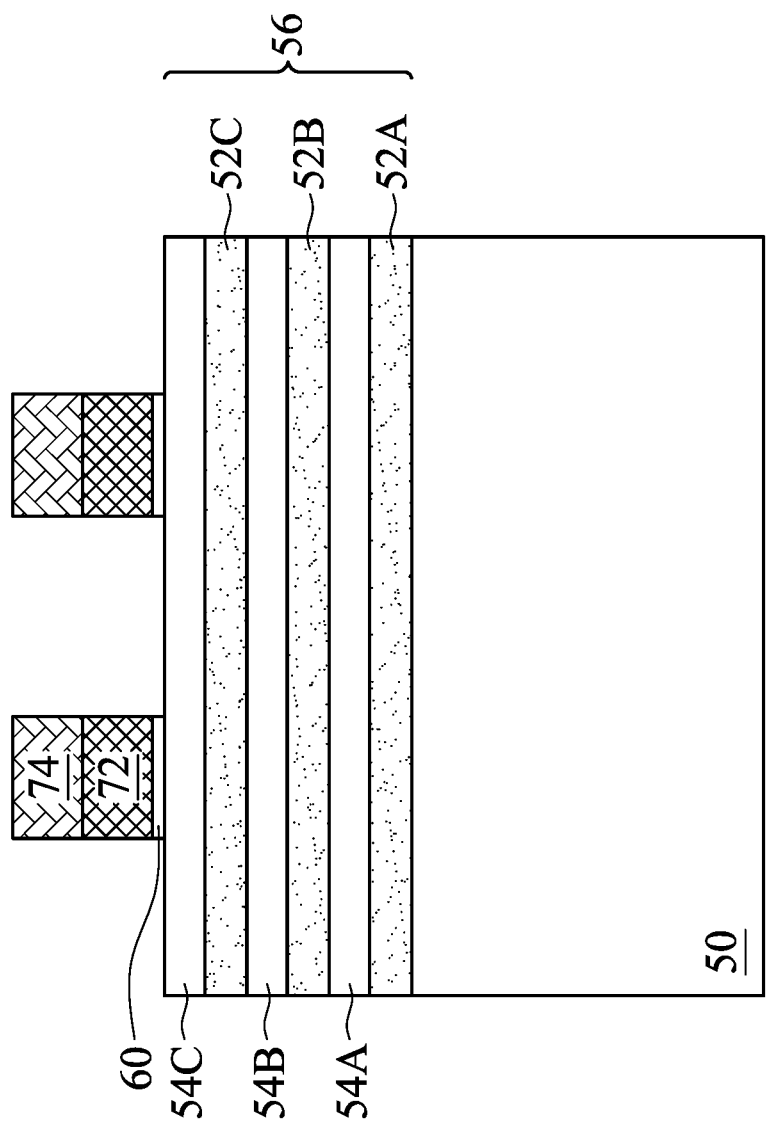

In FIGS. 6A and 6B, the mask layer 64 (see FIG. 5) may be patterned using acceptable photolithography and etching techniques to form masks 74. An acceptable etching technique may be used to transfer the pattern of the masks 74 to the dummy gate layer 62 to form dummy gates 72. In some embodiments, the pattern of the masks 74 may also be transferred to the dummy dielectric layers 60. The dummy gates 72 cover respective channel regions of the nanostructures 55. In an embodiment, the channel regions may be formed in the second semiconductor layers 54A-54C including the second semiconductor materials. The pattern of the masks 74 may be used to physically separate each of the dummy gates 72 from adjacent dummy gates 72. The dummy gates 72 may have a lengthwise direction substantially perpendicular to lengthwise directions of respective nanostructures 55.

In FIGS. 7A and 7B, a first spacer layer 80 and a second spacer layer 82 are formed over the structures illustrated in FIGS. 6A and 6B. In FIGS. 7A and 7B, the first spacer layer 80 is formed on top surfaces of the STI regions 58, top surfaces and sidewalls of the nanostructures 55 and the masks 74, and sidewalls of the substrate 50, the dummy gates 72 and the dummy dielectric layers 60. The second spacer layer 82 is deposited over the first spacer layer 80. The first spacer layer 80 may be formed by thermal oxidation or deposited by CVD, ALD, or the like. The first spacer layer 80 may be formed of silicon oxide, silicon nitride, silicon oxynitride, or the like. The second spacer layer 82 may be deposited by CVD, ALD, or the like. The second spacer layer 82 may be formed of silicon oxide, silicon nitride, silicon oxynitride, or the like.

Figures 8A, 8B:
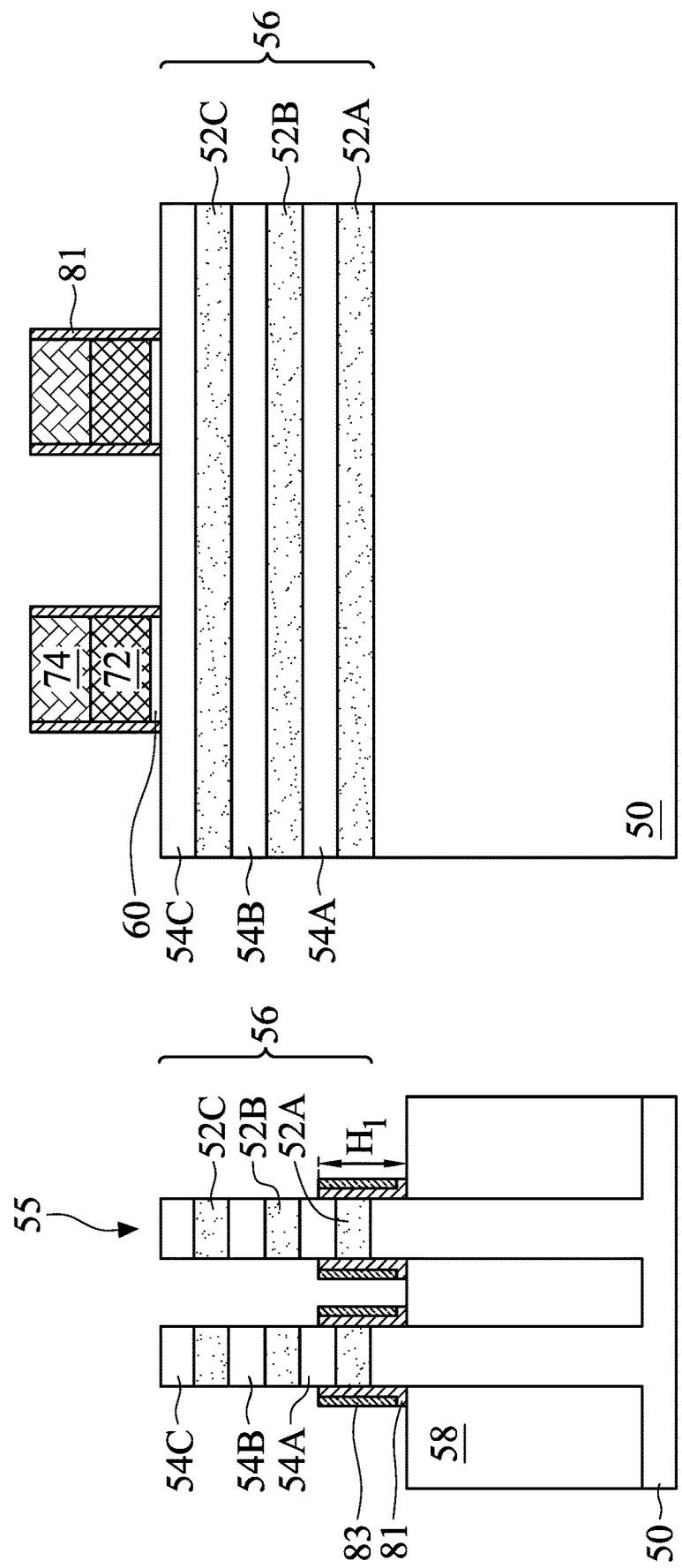
Figure 8C:
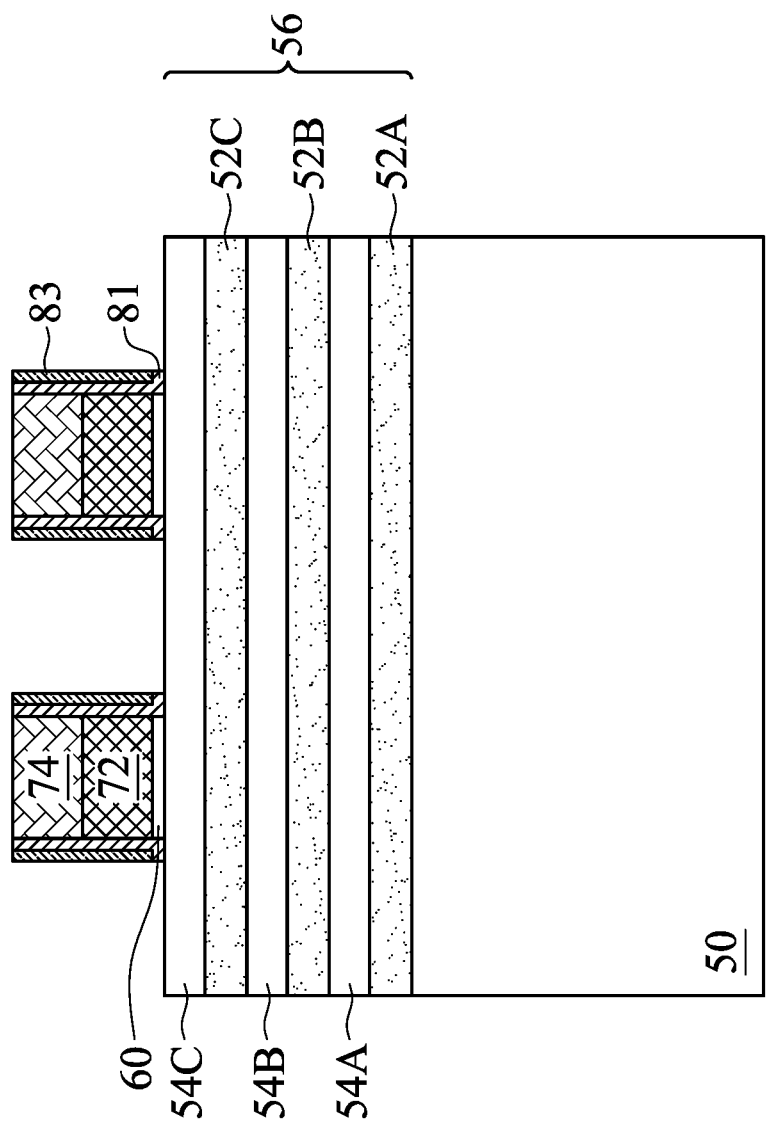

In FIGS. 8A and 8B, the first spacer layer 80 and the second spacer layer 82 are etched to form first spacers 81 and second spacers 83. The first spacer layer 80 and the second spacer layer 82 may be etched using a suitable etching process, such as an isotropic etching process (e.g., a wet etching process), an anisotropic etching process (e.g., a dry etching process), or the like. As illustrated in FIG. 8A, the first spacers 81 and the second spacers 83 are disposed on sidewalls of the nanostructures 55 and the substrate 50. As illustrated in FIG. 8B, the second spacer layer 82 may be removed from over the first spacer layer 80 adjacent the masks 74, the dummy gates 72, and the dummy dielectric layers 60 and the first spacers 81 are disposed on sidewalls of the masks 74, the dummy gates 72, and the dummy dielectric layers 60. In another embodiment, as illustrated in FIG. 8C, some portion of the second spacer layer 82 remains on the first spacer layer 80 adjacent the masks 74, the dummy gates 72, and the dummy dielectric layers 60 and the second spacers 83 are disposed on sidewalls of the masks 74, the dummy gates 72, and the dummy dielectric layers 60.

After the first spacers 81 and the second spacers 83 are formed, implants for lightly doped source/drain (LDD) regions (not separately illustrated) may be performed. In embodiments with different device types, similar to the implants discussed above in FIG. 4, a mask, such as a photoresist, may be formed over the region 50N, while exposing the region 50P, and appropriate type (e.g., p-type) impurities may be implanted into the exposed nanostructures 55 and the substrate 50 in the region 50P. The mask may then be removed. Subsequently, a mask, such as a photoresist, may be formed over the region 50P while exposing the region 50N, and appropriate type impurities (e.g., n-type) may be implanted into the exposed nanostructures 55 and the substrate 50 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $1\times10^{15}$ atoms/cm$^3$ to about $1\times10^{19}$ atoms/cm$^3$, such as about $5\times10^{18}$ atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the first spacers 81 may be formed prior to forming the second spacers 83, additional spacers may be formed and removed, and/or the like. Furthermore, the n-type and p-type devices may be formed using a different structures and steps.

Figure 9B:
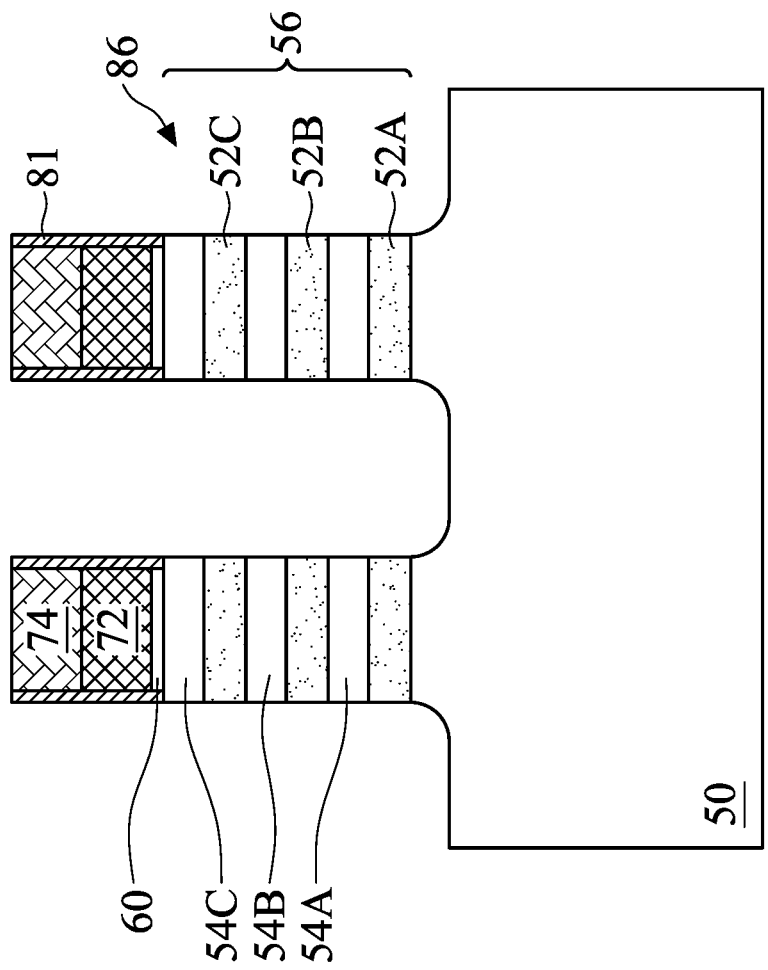
Figure 9A:
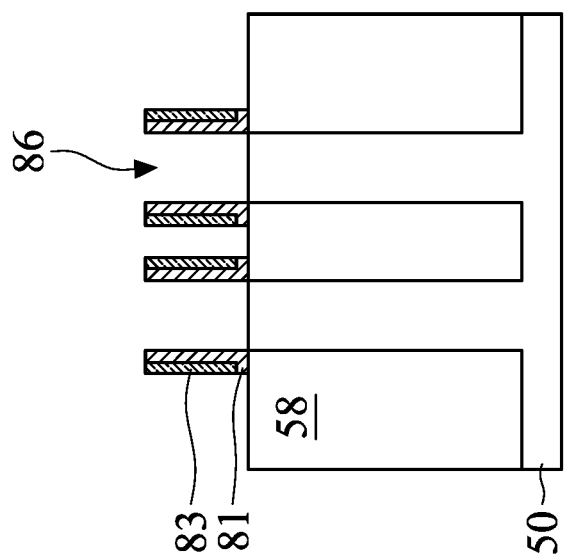

In FIGS. 9A and 9B, first recesses 86 are formed in the nanostructures 55 and the substrate 50. The first recesses 86 may extend through the first semiconductor layers 52A-52C and the second semiconductor layers 54A-54C, and into the substrate 50. As illustrated in FIG. 9A, top surfaces of the STI regions 58 may be level with a top surface of the substrate 50. In various embodiments, the first recesses may extend to a top surface of the substrate 50 without etching the substrate 50; the substrate 50 may be etched such that bottom surfaces of the first recesses 86 are disposed below the top surfaces of the STI regions 58; or the like. The first recesses 86 may be formed by etching the nanostructures 55 and the substrate 50 using anisotropic etching processes, such as RIE, NBE, or the like. In some embodiments, anisotropic etching processes include etchants such as hydrogen bromide (HBr), chlorine (Cl$_2$), the like, or a combination thereof. The first spacers 81, the second spacers 83, and the masks 74 mask portions of the nanostructures 55 and the substrate 50 during the etching processes used to form the first recesses 86. A single etch process may be used to etch each layer of the multi-layer stack 56. In other embodiments, multiple etch processes may be used to etch the layers of the multi-layer stack 56. Timed etch processes may be used to stop the etching of the first recesses 86 after the first recesses 86 reach a desired depth.

Figure 10B:
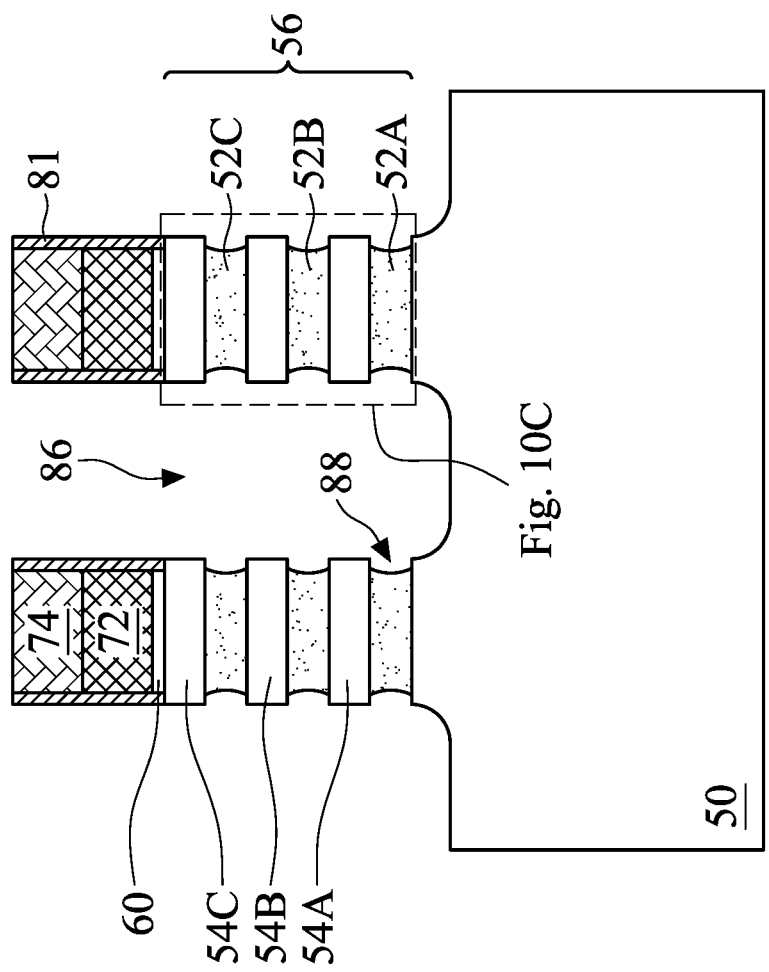
Figure 10A:
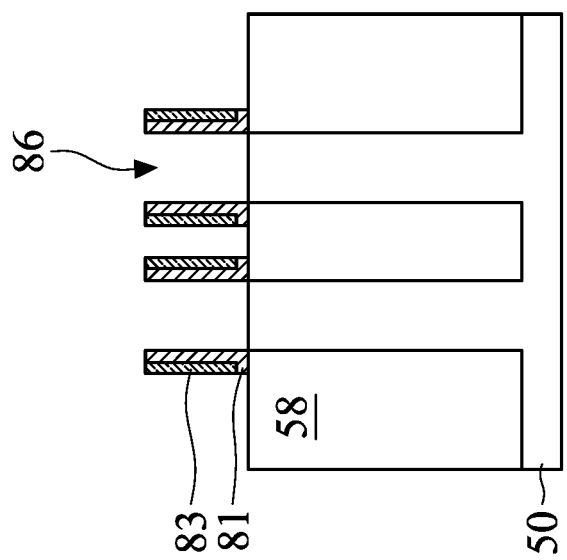
Figure 10C:
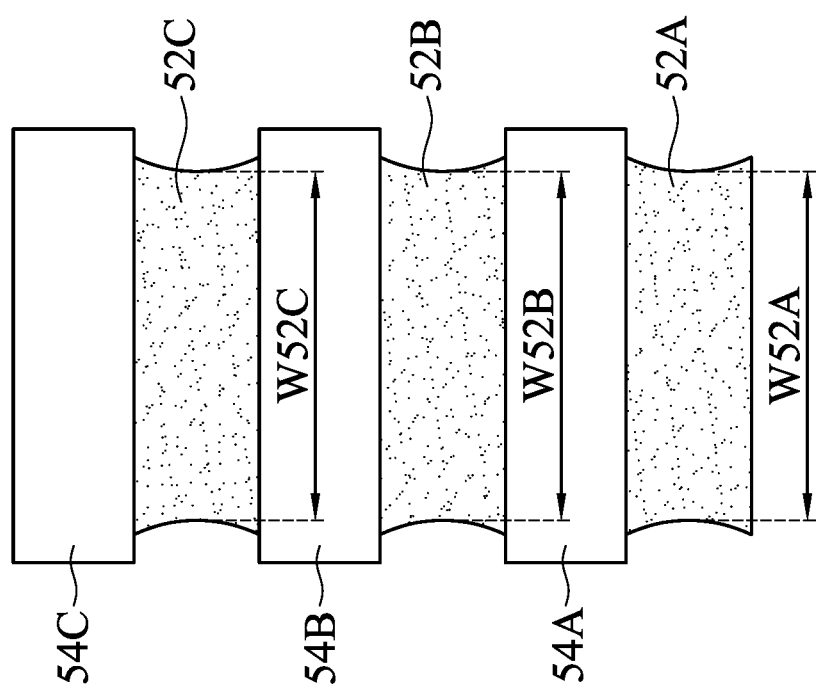

In FIGS. 10A and 10B, portions of sidewalls of the layers of the multi-layer stack 56 formed of the first semiconductor materials (e.g., the first semiconductor layers 52A-52C) exposed by the first recesses 86 are etched to form sidewall recesses 88. FIG. 10C illustrates a detailed view of a portion of a multi-layer stack 56 from FIG. 10B. The sidewalls may be etched using isotropic etching processes, such as wet etching or the like. In some embodiments, the recessed sidewalls of the first semiconductor layers 52A-52C have concave surfaces from the isotropic etching processes. The etchants used to etch the first semiconductor layers 52A-52C may be selective to the first semiconductor materials such that the second semiconductor layers 54A-54C and the substrate 50 remain relatively unetched as compared to the first semiconductor layers 52A-52C. In an embodiment in which the first semiconductor layers 52A-52C include, e.g., SiGe, and the second semiconductor layers 54A-54C include, e.g., Si or SiC, ammonia (NH$_3$), tetramethylammonium hydroxide (TMAH), ammonium hydroxide (NH$_4$OH), or the like may be used to etch sidewalls of the multi-layer stack 56. In further embodiments, the layers of the multi-layer stack 56 may be etched using a dry etching process. Hydrogen fluoride, another fluorine-based gas, or the like may be used to etch sidewalls of the multi-layer stack 56.

As illustrated in FIG. 10C, each of the first semiconductor layers 52A, 52B, and 52C have a corresponding width W52A, W52B, and W52C measured from opposing sidewalls of the first semiconductor layers 52A, 52B, and 52C. In an embodiment in which the first semiconductor layers 52A-52C include, e.g., SiGe, and where the atomic concentration of germanium decreases moving from the bottom first semiconductor layer 52A to the top first semiconductor layer 52C, the widths W52A, W52B, and W52C are substantially equal after the isotropic etching process. By increasing the amount of germanium in the lower layers of the first semiconductor layers 52, the etch rate for those lower layers is greater than the upper layers of the first semiconductor layers 52 such that the lower layers 52 can etch the same amount as the upper layers 52, and thus, leading to substantially equal widths W52A, W52B, and W52C.

As illustrated in FIGS. 10B and 10C, isotropic etching processes generally form concave surfaces on the surfaces that they etch, such as the concave surfaces of the sidewalls of the first semiconductor layers 52A-52C in FIGS. 10B and 10C. In some embodiments, the first semiconductor layers 52A-52C can be modified to achieve different shapes for the sidewall surfaces of the first semiconductor layers 52A-52C. FIGS. 11A-13B are cross-sectional views of intermediate stages similar to those of FIGS. 10A-10C in accordance with some of those other embodiments. In FIGS. 11A-13B, the composition of the first semiconductor layers 52A-52C is modified to control the shape of the sidewall surfaces after they are recessed by an isotropic etching process.

For the embodiments of FIGS. 11A-13B, the processing steps before the intermediate stage of processing in FIGS. 11A-13B can be achieved similar to that described in FIGS. 1-9B above and the description of arriving at this intermediate stage of processing is not repeated herein. Details regarding this embodiment that are similar to those for the previously described embodiment will not be repeated herein.

Figure 11B:
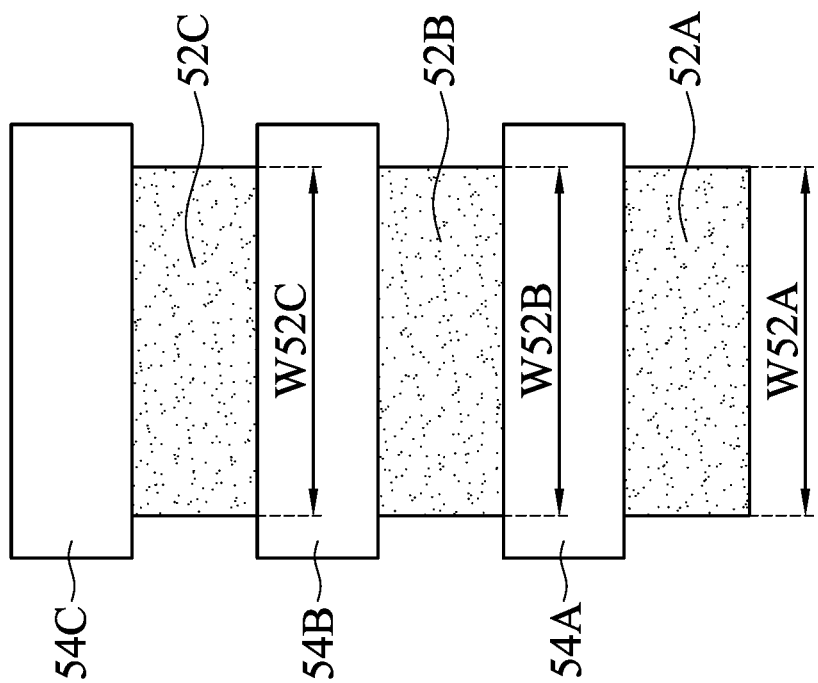
Figure 11A:
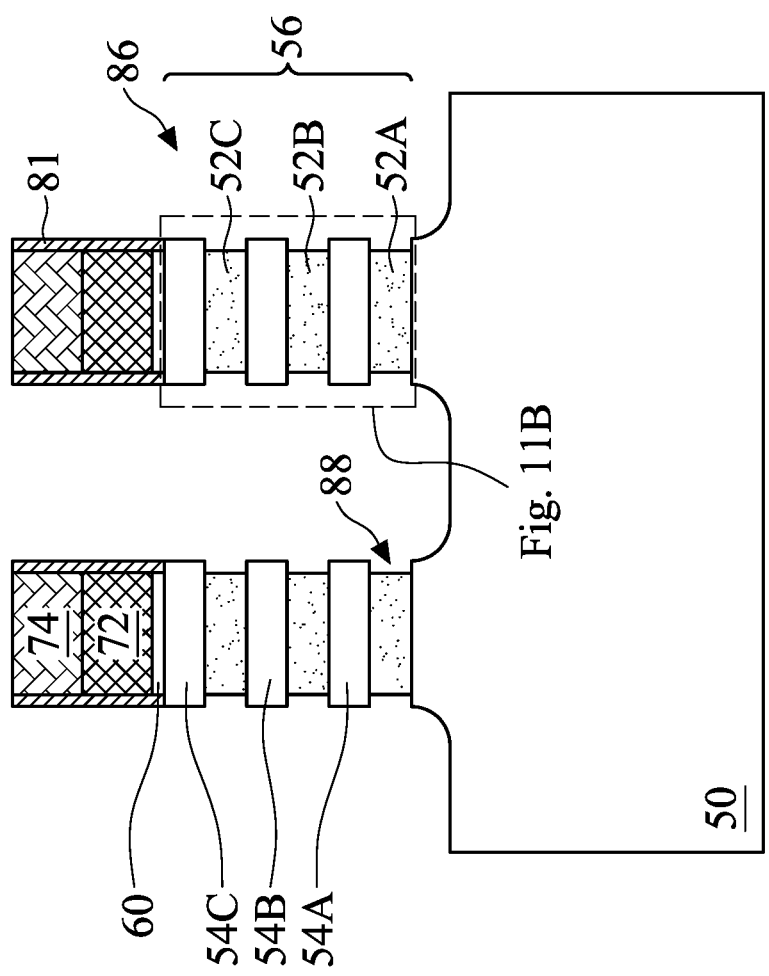

In FIGS. 11A and 11B, the composition within each of the first semiconductor layers 52A-52C varies to enable the sidewall surface to have a substantially planar shape. For example, when the top first semiconductor layer 52A includes, e.g., SiGe, the atomic concentration of germanium (Ge) can be varied within the top first semiconductor layer 52A to control the shape of the sidewall surface after the isotropic etching process. For the embodiment illustrated in FIGS. 11A and 11B, the atomic concentration of germanium (Ge) is higher in the top and bottom portions of the layer 52A (e.g., portions near the layer 54A and substrate 50) than the middle portion of the layer 52A. The transition from the high concentration portion to the low concentration portion can be a gradual transition or can be an abrupt or step-type transition depending on the desired sidewall surface shape. By having higher amounts of germanium in the in the top and bottom portions of each of the first semiconductor layers 52 than the respective middle portions of those layers 52, the etch rate for the top and bottom portions is greater than the middle portions of those layers to allow for the isotropic etch process to produce a substantially planar sidewall surface instead of the concave sidewall surface. In this embodiment, the first semiconductor layers 52B and 52C have a similar composition profile as first semiconductor layer 52A and the description is not repeated herein.

In FIGS. 12A and 12B, the composition within each of the first semiconductor layers 52A-52C varies to enable the sidewall surface to have a substantially notched shape. For example, when the top first semiconductor layer 52A includes, e.g., SiGe, the atomic concentration of germanium (Ge) can be varied within the top first semiconductor layer 52A to control the shape of the sidewall surface after the isotropic etching process. For the embodiment illustrated in FIGS. 12A and 12B, the atomic concentration of germanium (Ge) is lower in the top and bottom portions of the layer 52A (e.g., portions near the layer 54A and substrate 50) than the middle portion of the layer 52A. The transition from the low concentration portion to the high concentration portion can be a gradual transition or can be an abrupt or step-type transition depending on the desired sidewall surface shape. By having lower amounts of germanium in the in the top and bottom portions of each of the first semiconductor layers 52 than the respective middle portions of those layers 52, the etch rate for the top and bottom portions is less than the middle portions of those layers to allow for the isotropic etch process to produce a substantially notched sidewall surface instead of the concave sidewall surface. In this embodiment, the first semiconductor layers 52B and 52C have a similar composition profile as first semiconductor layer 52A and the description is not repeated herein.

Figure 13B:
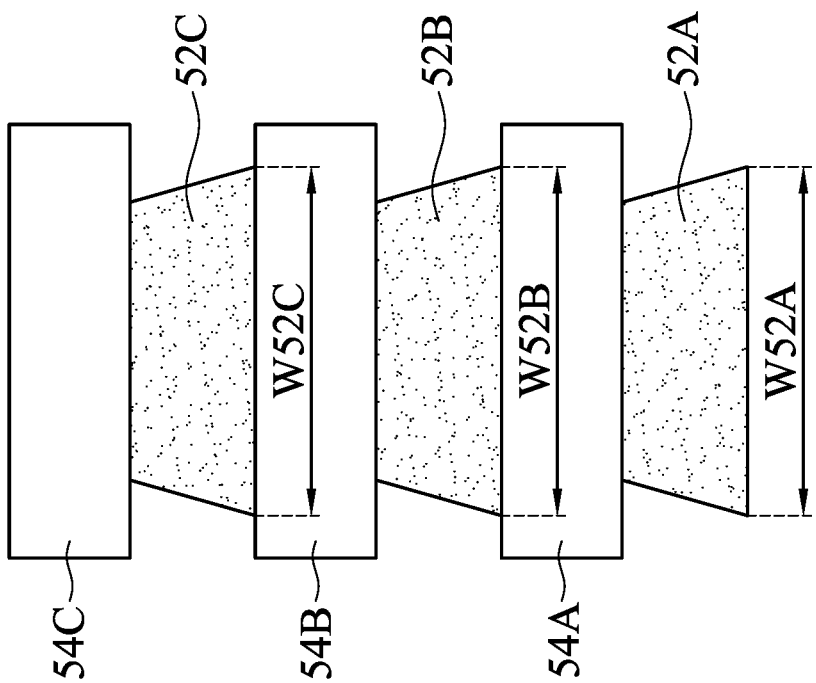
Figure 13A:
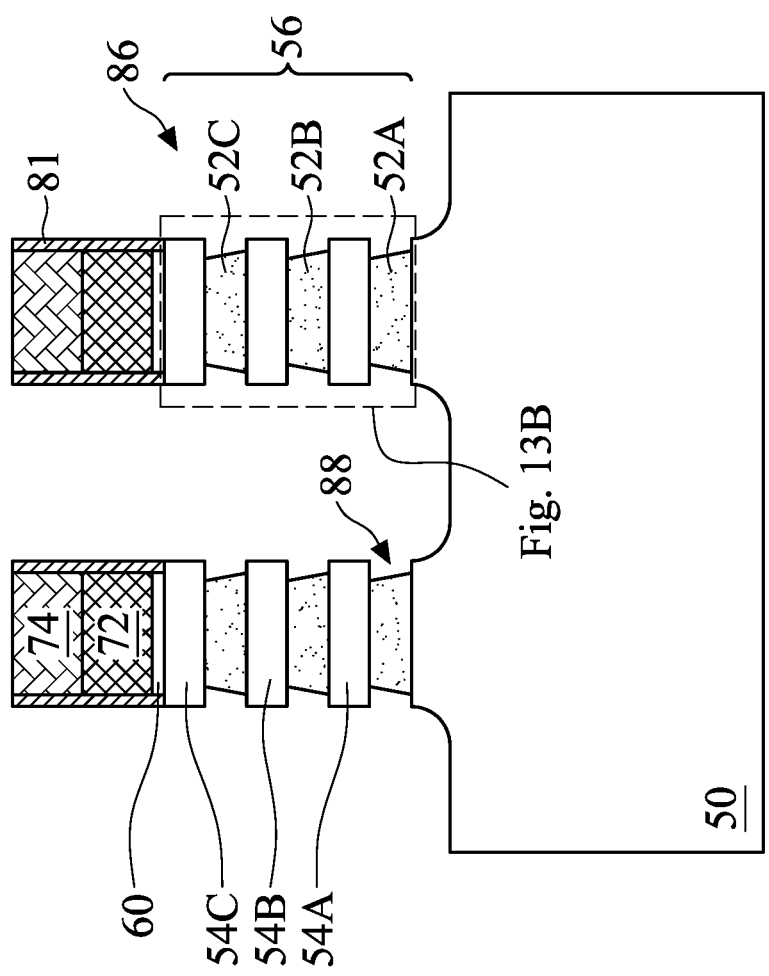

In FIGS. 13A and 13B, the composition within each of the first semiconductor layers 52A-52C varies to enable the sidewall surface to have a substantially tapered shape. For example, when the top first semiconductor layer 52A includes, e.g., SiGe, the atomic concentration of germanium (Ge) can be varied within the top first semiconductor layer 52A to control the shape of the sidewall surface after the isotropic etching process. For the embodiment illustrated in FIGS. 13A and 13B, the atomic concentration of germanium (Ge) is higher in the upper portion of the layer 52A (e.g., portion near the layer 54A) than the lower portion of the layer 52A (e.g., portion near the substrate 50). The transition from the high concentration portion to the low concentration portion can be a gradual transition or can be an abrupt or step-type transition depending on the desired sidewall surface shape. By having higher amounts of germanium in the in the upper portion of each of the first semiconductor layers 52 than the respective lower portion of those layers 52, the etch rate for the top portion is greater than the lower portion of those layers to allow for the isotropic etch process to produce a substantially tapered sidewall surface instead of the concave sidewall surface. In this embodiment, the first semiconductor layers 52B and 52C have a similar composition profile as first semiconductor layer 52A and the description is not repeated herein.

FIGS. 14A-22B are cross-sectional views of intermediate stages in the continued manufacturing of the NSFETs, in accordance with some embodiments. While the subsequent steps in FIGS. 14A-22B are shown on the embodiment of the first semiconductor layers 52A-52C of FIGS. 11A and 11B (e.g., the embodiment with substantially planar sidewall surfaces), the subsequent steps in FIGS. 14A-22B are also applicable to the embodiments in FIGS. 10A-10C, 12A-12B, and 13A-13B.

Figure 14B:
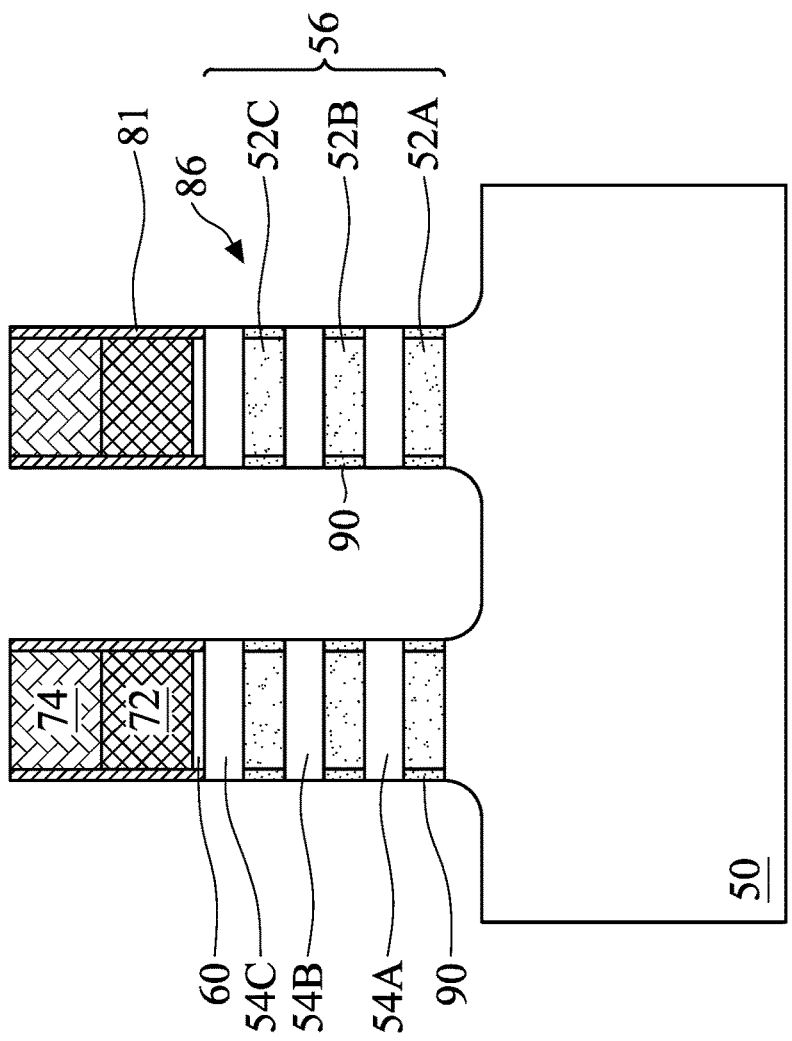
Figure 14A:
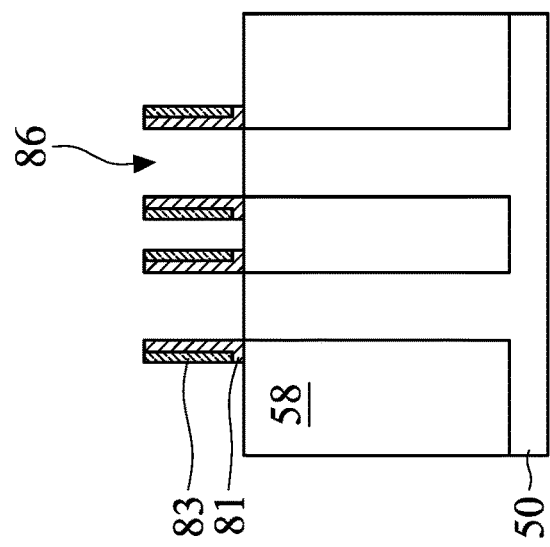

In FIGS. 14A and 14B, inner spacers 90 are formed in the sidewall recess 88. The inner spacers 90 may be formed by depositing an inner spacer layer (not separately illustrated) over the structures illustrated in FIGS. 11A and 11B. The inner spacer layer may be deposited by a conformal deposition process, such as CVD, ALD, or the like. The inner spacer layer may comprise a material such as silicon nitride (SiN) or silicon oxynitride (SiON), although any suitable material, such as low-dielectric constant (low-k) materials having a k-value less than about 3.5, may be utilized. The inner spacer layer may then be etched to form the inner spacers 90. The inner spacer layer may be etched by an anisotropic etching process, such as RIE, NBE, or the like. The inner spacers 90 may be used to prevent damage to subsequently formed source/drain regions (such as the epi- taxial source/drain regions 92, discussed below with respect to FIGS. 15A-15C) by subsequent etching processes.

Figure 15B:
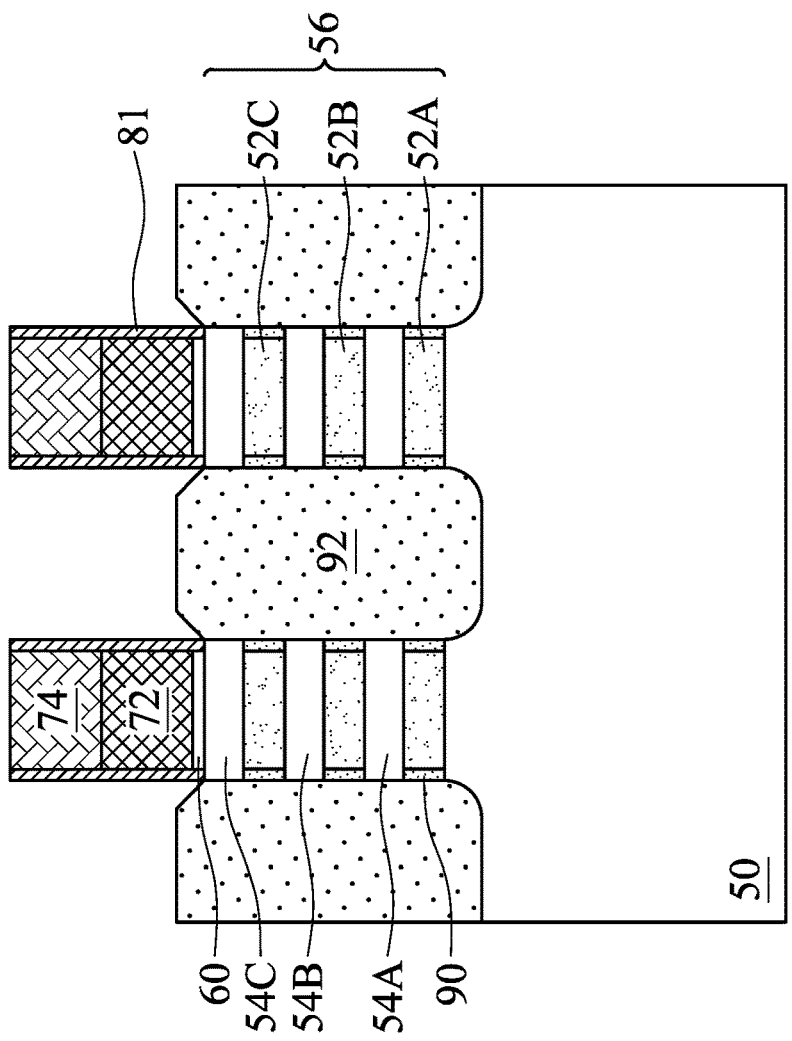
Figure 15A:
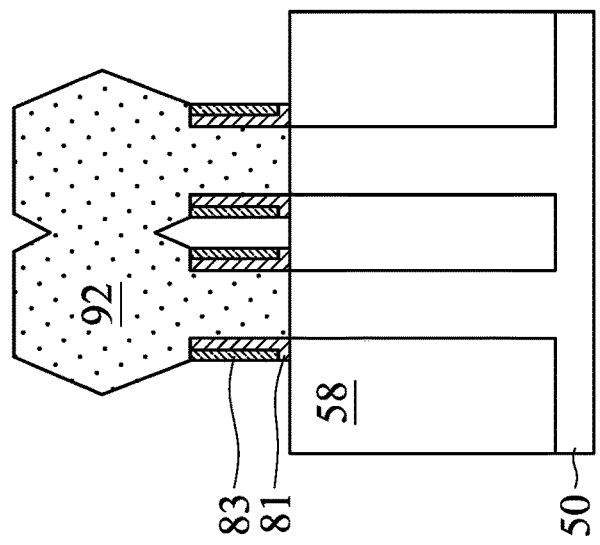

In FIGS. 15A-15C, epitaxial source/drain regions 92 are formed in the first recesses 86 to exert stress on the second semiconductor layers 54A-54C of the nanostructures 55, thereby improving performance. As illustrated in FIG. 15B, the epitaxial source/drain regions 92 are formed in the first recesses 86 such that each dummy gate 72 is disposed between respective neighboring pairs of the epitaxial source/ drain regions 92. In some embodiments, the first spacers 81 are used to separate the epitaxial source/drain regions 92 from the dummy gates 72 by an appropriate lateral distance so that the epitaxial source/drain regions 92 do not short out subsequently formed gates of the resulting NSFETs. The inner spacers 90 may be used to separate the epitaxial source/drain regions 92 from the first semiconductor layers 52A-52C by appropriate lateral distances to prevent shorts between the epitaxial source/drain regions 92 and the subsequently formed gates of the resulting NSFETs.

The epitaxial source/drain regions 92 in the region 50N, e.g., the NMOS region, may be formed by masking the region 50P, e.g., the PMOS region. Then, the epitaxial source/drain regions 92 are epitaxially grown in the first recesses 86. The epitaxial source/drain regions 92 may include any acceptable material, such as appropriate for n-type NSFETs. For example, if the second semiconductor layers 54A-54C are silicon, the epitaxial source/drain regions 92 may include materials exerting a tensile strain on the second semiconductor layers 54A-54C, such as silicon, phosphorous doped silicon, carbon doped silicon, carbon and phosphorous doped silicon, the like or a combination thereof. The epitaxial source/drain regions 92 may have surfaces raised from respective surfaces of the multi-layer stack 56 and may have facets.

The epitaxial source/drain regions 92 in the region 50P, e.g., the PMOS region, may be formed by masking the region 50N, e.g., the NMOS region. Then, the epitaxial source/drain regions 92 are epitaxially grown in the first recesses 86. The epitaxial source/drain regions 92 may include any acceptable material, such as appropriate for p-type NSFETs. For example, if the second semiconductor layers 54A-54C are silicon, the epitaxial source/drain regions 92 may comprise materials exerting a compressive strain on the second semiconductor layers 54A-54C, such as silicon-germanium, boron doped silicon-germanium, germanium, germanium tin, or the like. The epitaxial source/ drain regions 92 may also have surfaces raised from respective surfaces of the multi-layer stack 56 and may have facets.

The epitaxial source/drain regions 92, the second semiconductor layers 54A-54C, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/$cm^3$ and about $1\times10^{21}$ atoms/$cm^3$, such as about $5.05\times10^{20}$ atoms/$cm^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the region 50N and the region 50P, upper surfaces of the epitaxial source/drain regions have facets which expand laterally outward beyond sidewalls of the nanostructures 55. In some embodiments, these facets cause adjacent epitaxial source/drain regions 92 of a same NSFET to merge as illustrated by FIG. 15A. In other embodiments, adjacent epitaxial source/drain regions 92 remain separated after the epitaxy process is completed as illustrated by FIG. 15C. In the embodiments illustrated in FIGS. 15A and 15C, the first spacers 81 may be formed covering portions of the sidewalls of the nanostructures 55 and the substrate 50 that extend above the STI regions 58 thereby blocking the epitaxial growth. In some other embodiments, the spacer etch used to form the first spacers 81 may be adjusted to remove the spacer material to allow the epitaxially grown region to extend to the surface of the STI region 58.

In FIGS. 16A and 16B, a first interlayer dielectric (ILD) 96 is deposited over the structure illustrated in FIGS. 6A and 15B (the processes of FIGS. 7A-15B do not alter the cross-section illustrated in FIGS. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81. The CESL 94 may comprise a dielectric material, such as, silicon nitride, silicon oxide, silicon oxynitride, or the like, having a different etch rate than the material of the overlying first ILD 96.

Figures 17A, 17B:
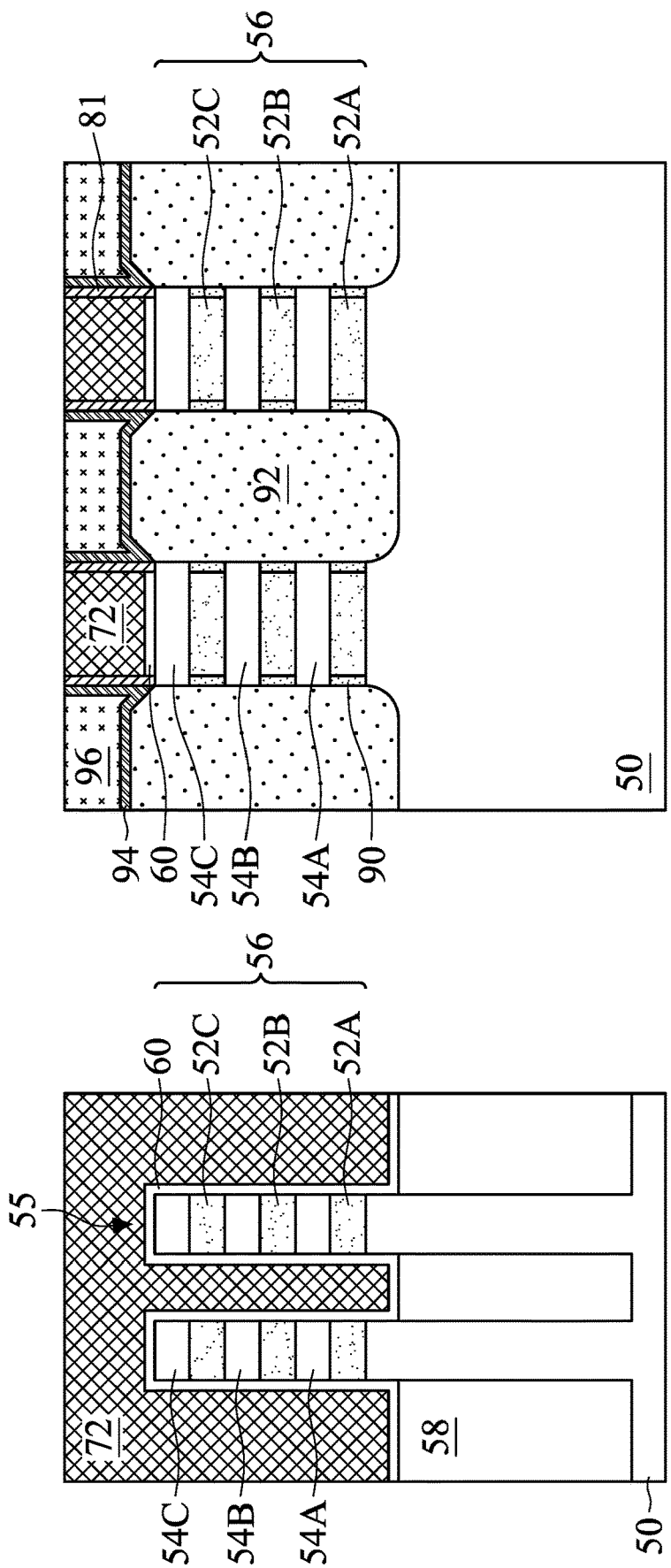

In FIGS. 17A and 17B, a planarization process, such as a CMP, may be performed to level the top surface of the first ILD 96 with the top surfaces of the dummy gates 72 or the masks 74. The planarization process may also remove the masks 74 on the dummy gates 72, and portions of the first spacers 81 along sidewalls of the masks 74. After the planarization process, top surfaces of the dummy gates 72, the first spacers 81, and the first ILD 96 are level. Accordingly, the top surfaces of the dummy gates 72 are exposed through the first ILD 96. In some embodiments, the masks 74 may remain, in which case the planarization process levels the top surface of the first ILD 96 with top surface of the masks 74 and the first spacers 81.

Figures 18A, 18B:
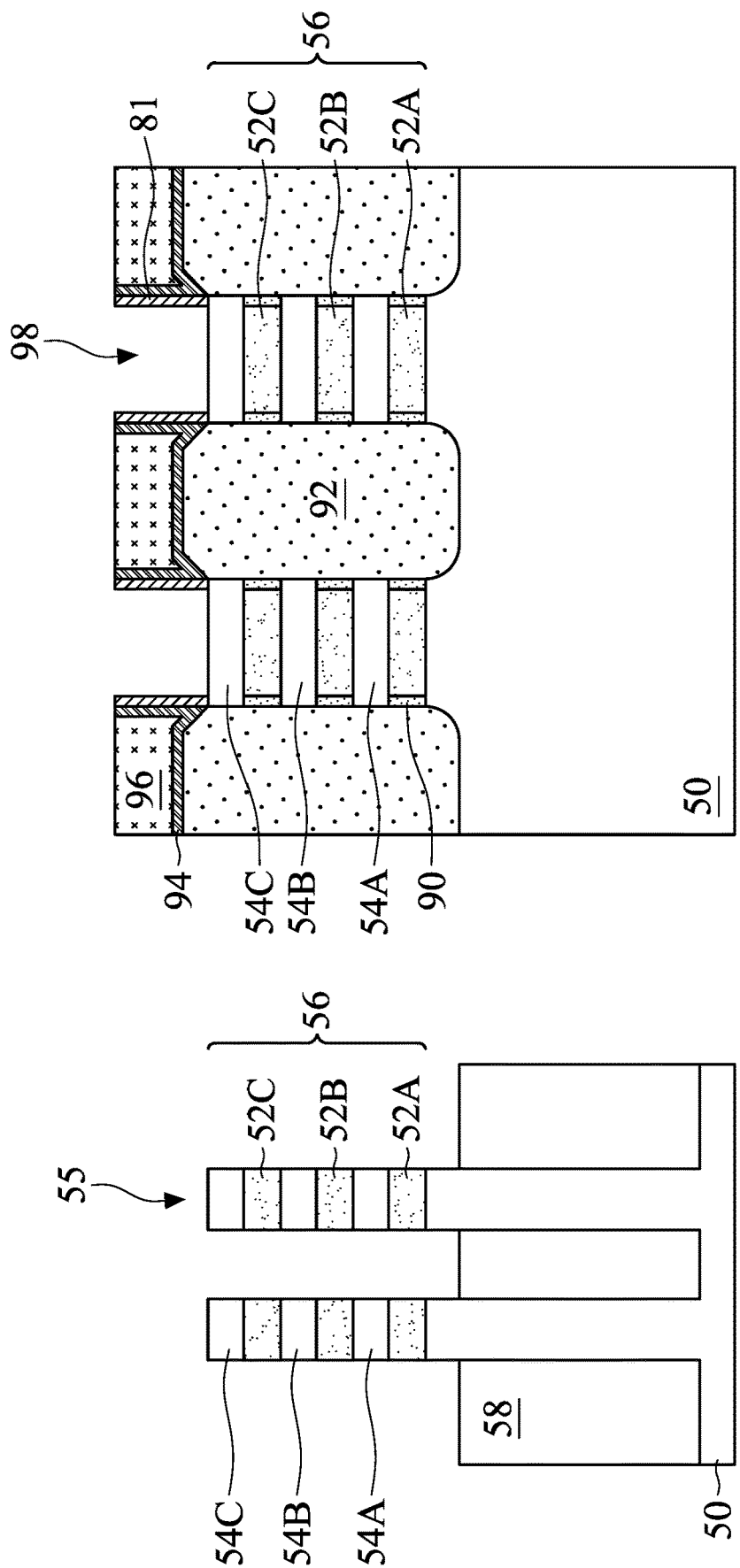

In FIGS. 18A and 18B, the dummy gates 72, and the masks 74 if present, are removed in an etching step(s), so that second recesses 98 are formed. Portions of the dummy dielectric layers 60 in the second recesses 98 may also be removed. In some embodiments, only the dummy gates 72 are removed and the dummy dielectric layers 60 remain and are exposed by the second recesses 98. In some embodiments, the dummy dielectric layers 60 are removed from second recesses 98 in a first region of a die (e.g., a core logic region) and remain in second recesses 98 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 at a faster rate than the first ILD 96 or the first spacers 81. Each second recess 98 exposes and/or overlies portions of the multi-layer stack 56, which act as channel regions in subsequently completed NSFETs. Portions of the multi-layer stack 56 which act as the channel regions are disposed between neighboring pairs of the epitaxial source/drain regions 92. During the removal, the dummy dielectric layers 60 may be used as etch stop layers when the dummy gates 72 are etched. The dummy dielectric layers 60 may then be optionally removed after the removal of the dummy gates 72.

Figure 19B:
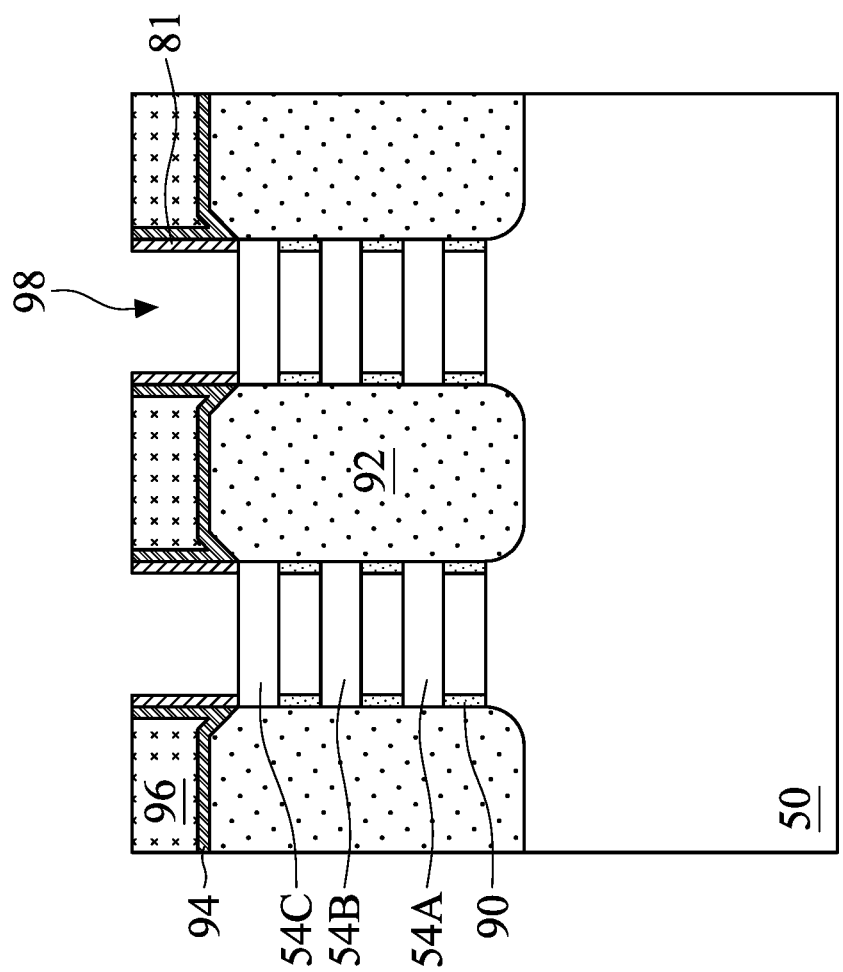
Figure 19A:
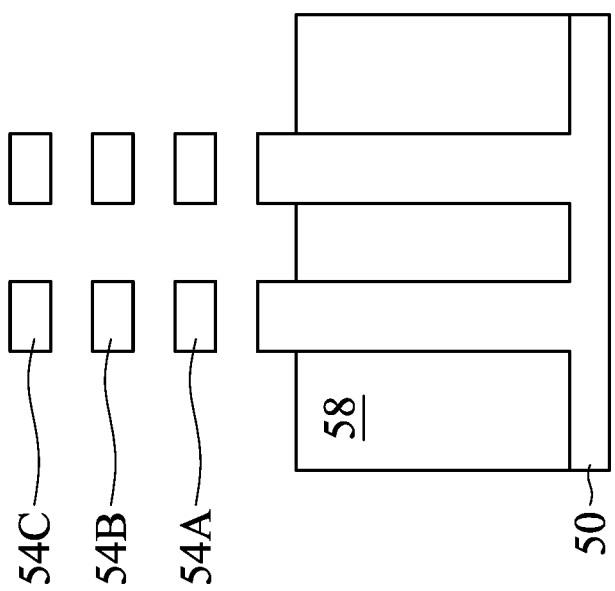

In FIGS. 19A and 19B, the first semiconductor layers 52A-52C are removed extending the second recesses 98. The first semiconductor layers 52A-52C may be removed by an isotropic etching process such as wet etching or the like. The first semiconductor layers 52A-52C may be removed using etchants which are selective to the materials of the first semiconductor layers 52A-52C, while the second semiconductor layers 54A-54C, the substrate 50, the STI regions 58 remain relatively unetched as compared to the first semiconductor layers 52A-52C. In an embodiment in which the first semiconductor layers 52A-52C include, e.g., SiGe, and the second semiconductor layers 54A-54C include, e.g., Si or SiC, ammonia ($NH_3$), tetramethylammonium hydroxide (TMAH), ammonium hydroxide ($NH_4OH$), or the like may be used to remove the first semiconductor layers 52A-52C.

Figure 20B:
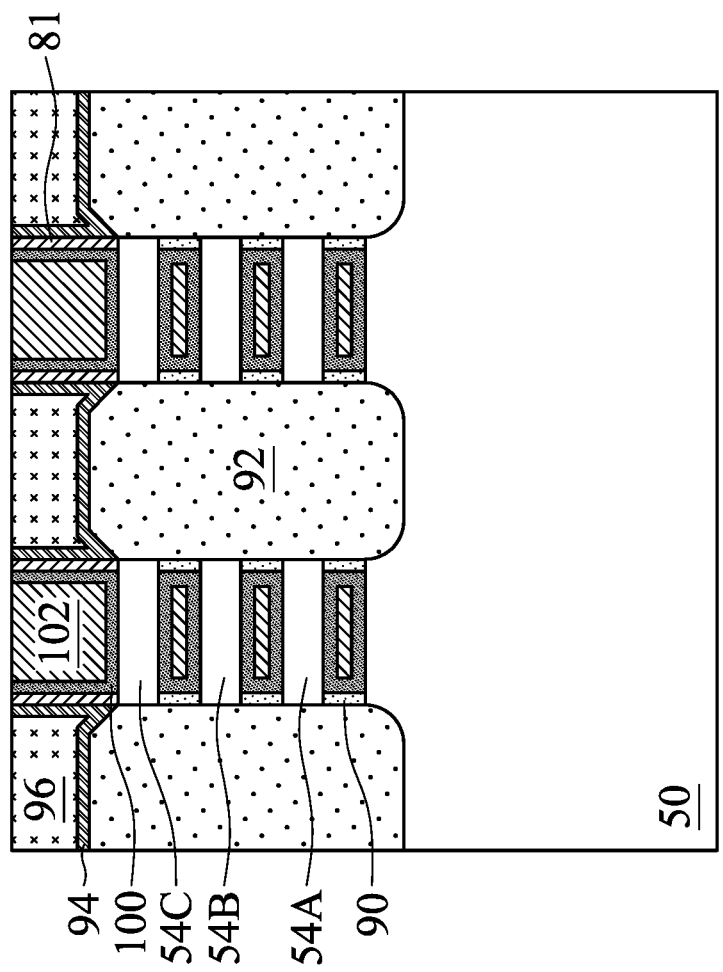
Figure 20A:
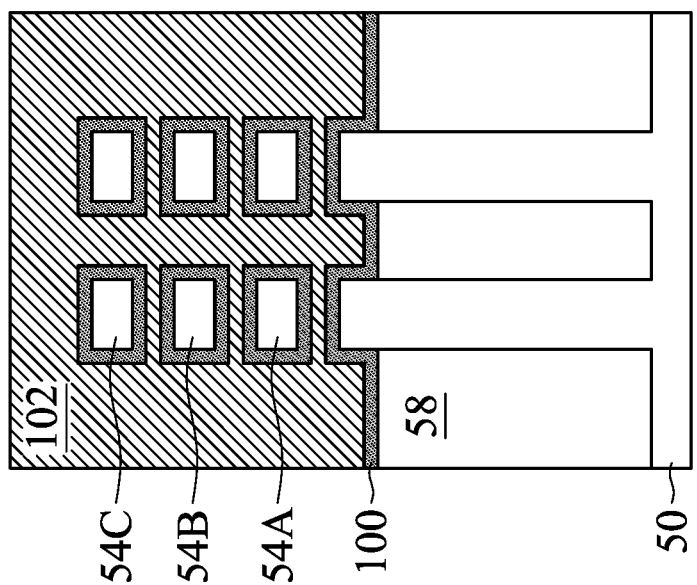

In FIGS. 20A and 20B, gate dielectric layers 100 and gate electrodes 102 are formed for replacement gates. The gate dielectric layers 100 are deposited conformally in the second recesses 98, such as on top surfaces and sidewalls of the substrate 50 and on top surfaces, sidewalls, and bottom surfaces of the second semiconductor layers 54A-54C. The gate dielectric layers 100 may also be deposited on top surfaces of the first ILD 96, the CESL 94, the first spacers 81, and the STI regions 58. In accordance with some embodiments, the gate dielectric layers 100 comprise silicon oxide, silicon nitride, or multilayers thereof. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 20A and 20B, the gate electrodes 102 may comprise any number of liner layers, any number of work function tuning layers, and a fill material. Any combination of the layers which make up the gate electrodes 102 may be deposited in the areas between each of the second semiconductor layers 54A-54C and between the second semiconductor layer 54A and the substrate 50. After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gates of the resulting NSFETs. The gate electrodes 102 and the gate dielectric layers 100 may be collectively referred to as "gate stacks."

The formation of the gate dielectric layers 100 in the region 50N and the region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials, and/or the gate electrodes 102 in each region may be formed by distinct processes, such that the gate electrodes 102 may be different materials. Various masking steps may be used to mask and expose appropriate regions when using distinct processes.

Figure 21B:
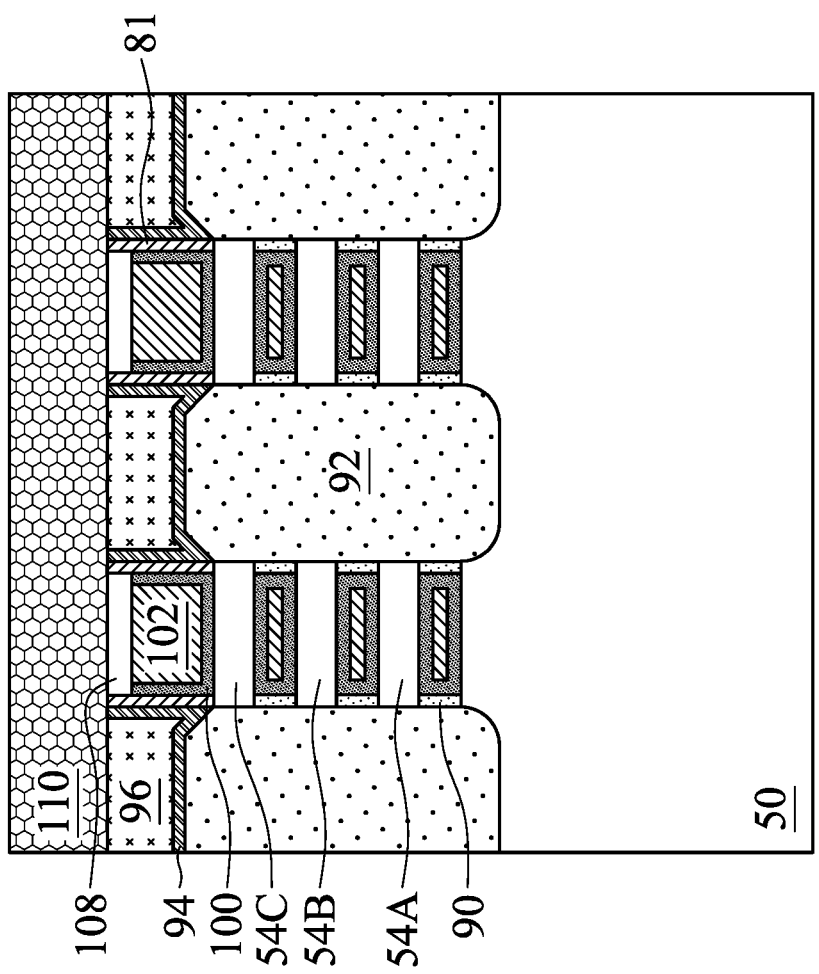
Figure 21A:
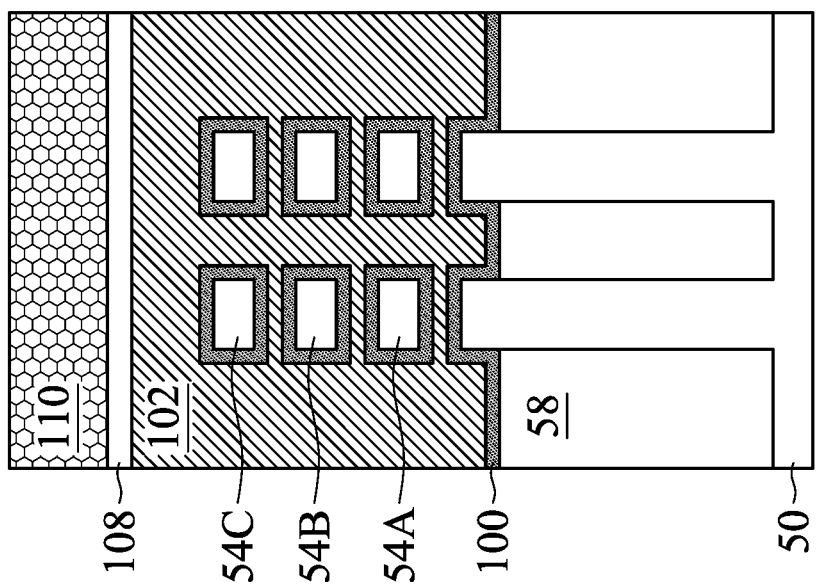

In FIGS. 21A and 21B, a second ILD 110 is deposited over the first ILD 96. In some embodiments, the second ILD 110 is a flowable film formed by FCVD. In some embodiments, the second ILD 110 is formed of a dielectric material such as PSG, BSG, BPSG, USG, or the like, and may be deposited by any suitable method, such as CVD, PECVD, or the like. In accordance with some embodiments, before the formation of the second ILD 110, the gate stack (including the gate dielectric layers 100 and the corresponding overlying gate electrodes 102) is recessed, so that a recess is formed directly over the gate stack and between opposing portions of first spacers 81. A gate mask 108 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 22A and 22B) penetrate through the gate mask 108 to contact the top surface of the recessed gate electrodes 102.

Figure 22B:
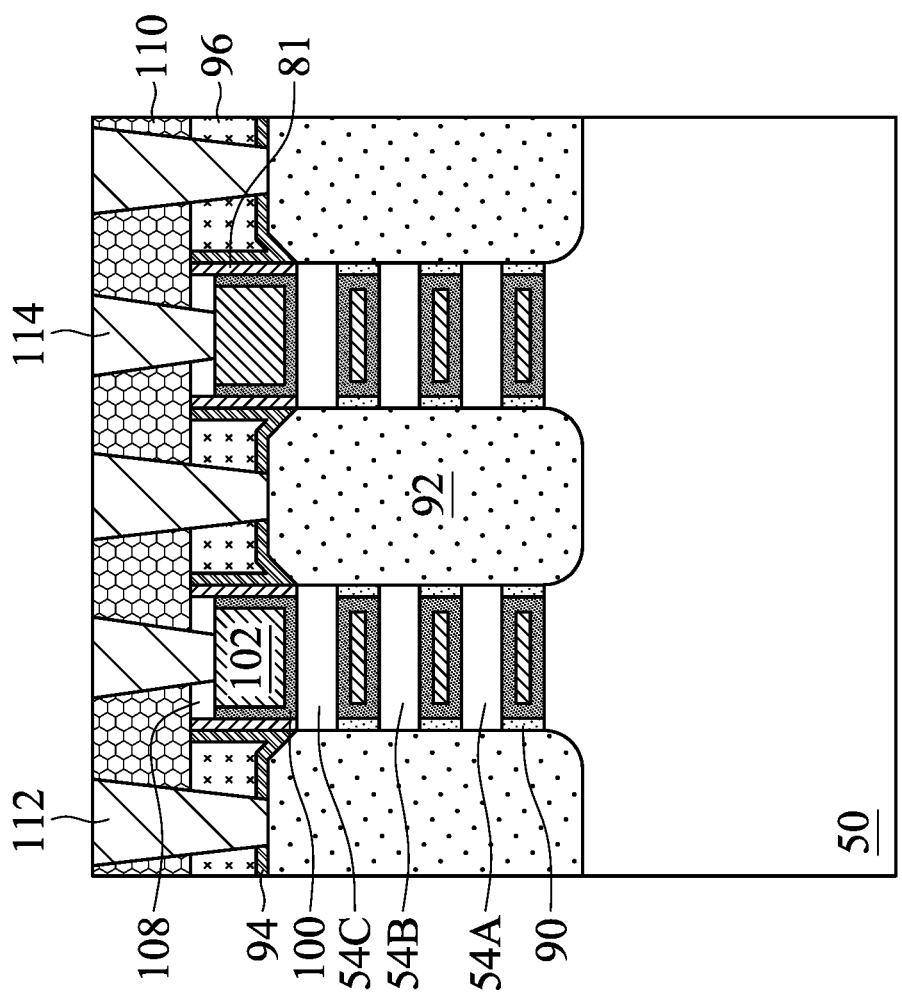
Figure 22A:
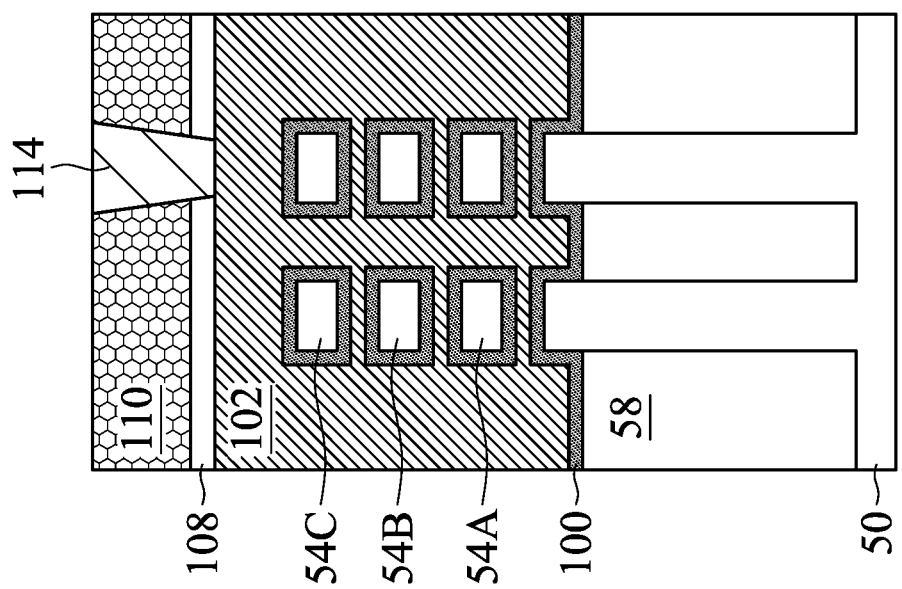

In FIGS. 22A and 22B, source/drain contacts 112 and gate contacts 114 are formed through the second ILD 110 and the first ILD 96. Openings for the source/drain contacts 112 are formed through the first ILD 96 and the second ILD 110, and openings for the gate contacts 114 are formed through the second ILD 110 and the gate mask 108. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 110. The remaining liner and conductive material form the source/drain contacts 112 and the gate contacts 114 in the openings. An anneal process may be performed to form a silicide at the interface between the epitaxial source/drain regions 92 and the source/drain contacts 112. The source/drain contacts 112 are physically and electrically coupled to the epitaxial source/drain regions 92, and the gate contacts 114 are physically and electrically coupled to the gate electrodes 102. The source/drain contacts 112 and the gate contacts 114 may be formed in different processes, or may be formed in the same process. Although shown as being formed in the same cross-sections, it should be appreciated that each of the source/drain contacts 112 and the gate contacts 114 may be formed in different cross-sections, which may avoid shorting of the contacts.

FIGS. 23 through 26B are cross-sectional views of intermediate steps during the manufacturing of the NSFETs, in accordance with some embodiments. FIG. 26A illustrates reference cross-section A-A' illustrated in FIG. 1. FIGS. 23, 24, 25A, and 26B illustrate reference cross-section B-B' illustrated in FIG. 1. The embodiment in FIGS. 23 through 26B is similar to the embodiments illustrated in FIGS. 1 through 22B except that this embodiment includes two inner spacer layers. Details regarding this embodiment that are similar to those for the previously described embodiment will not be repeated herein.

Figure 23:
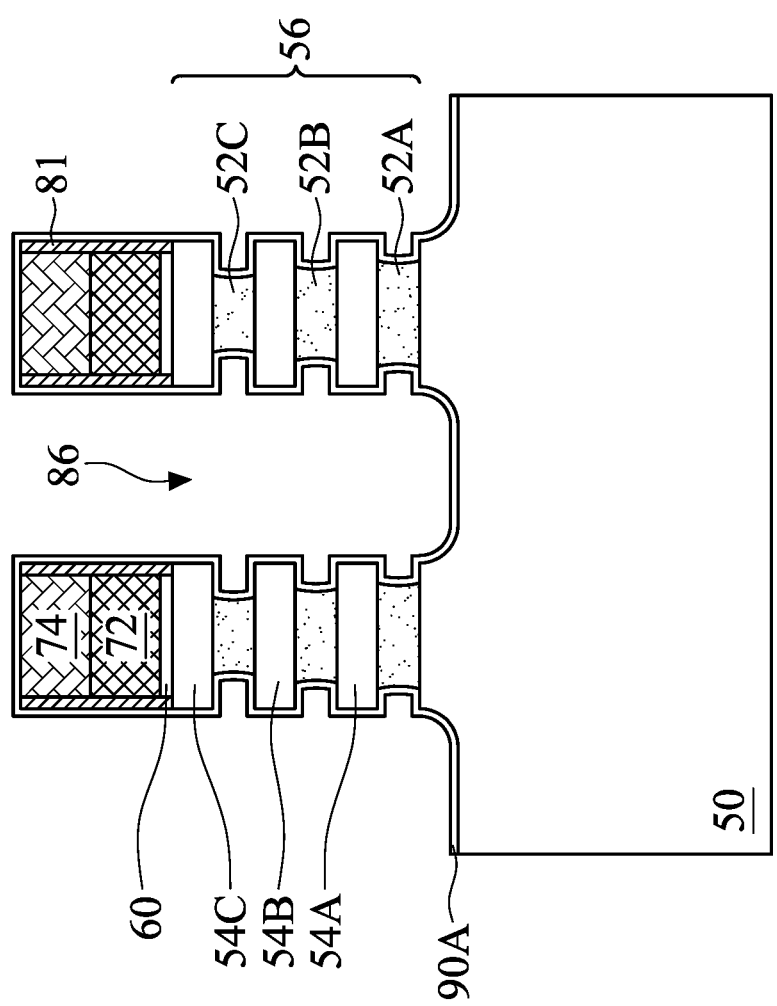
FIGS. 23, 24, 25A, 25B, 26A, and 26B are cross-sectional views of intermediate stages in the manufacturing of semiconductor devices, in accordance with some embodiments.

FIG. 23 illustrates an intermediate stage of processing similar to that described in FIGS. 10A-10C above and the description of forming this intermediate stage of processing is not repeated herein.

In FIG. 23, a first inner spacer layer 90A is formed over the structure illustrated in FIGS. 10A-10C. The first inner spacer layer 90A may be deposited by a conformal deposition process, such as CVD, ALD, or the like. The first inner spacer layer 90A may comprise a material such as silicon carbonitride (SiCN), silicon carbide (SiC), silicon carboxynitride (SiCON), the like, or a combination thereof. In some embodiments, the first inner spacer layer 90A is formed to have a thickness in a range from about 0.5 nm to about 2 nm, such as 1.5 nm.

Figure 24:
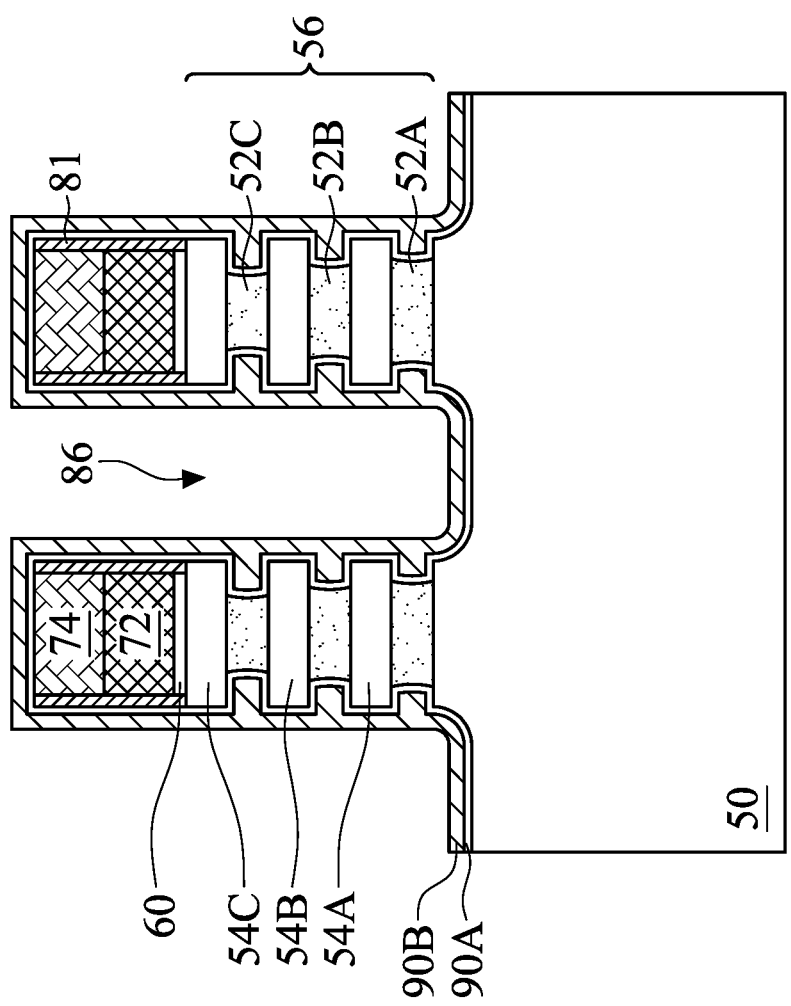

In FIG. 24, a second inner spacer layer 90B is formed over the first inner spacer layer 90A illustrated in FIG. 23. The second inner spacer layer 90B may be deposited by a conformal deposition process, such as CVD, ALD, or the like. The second inner spacer layer 90B may comprise a material such as silicon nitride (SiN), silicon carboxynitride (SiCON), silicon, silicon oxide (SiO), the like, or a combination thereof. In some embodiments, the second inner spacer layer 90B is formed to have a thickness in a range from about 2 nm to about 6 nm, such as 4 nm.

Figure 25B:
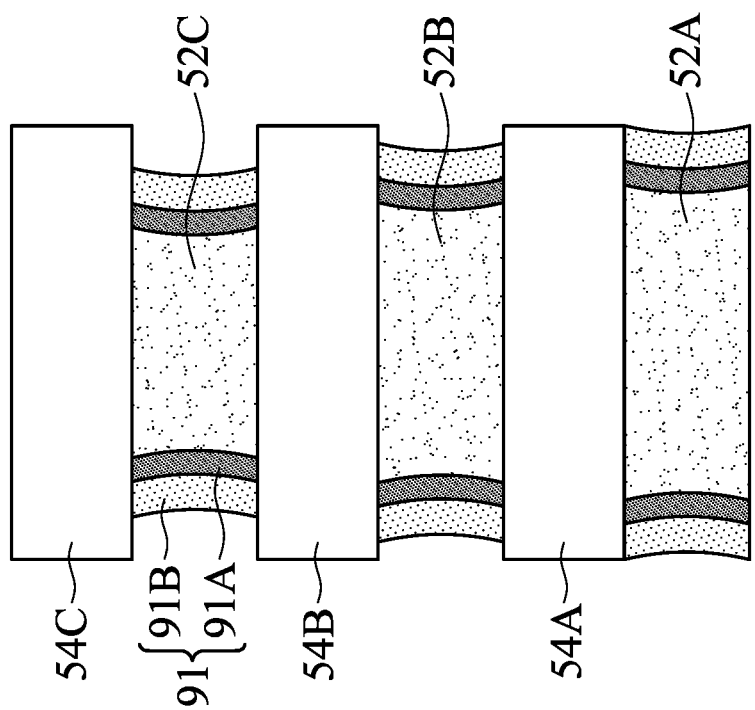
Figure 25A:
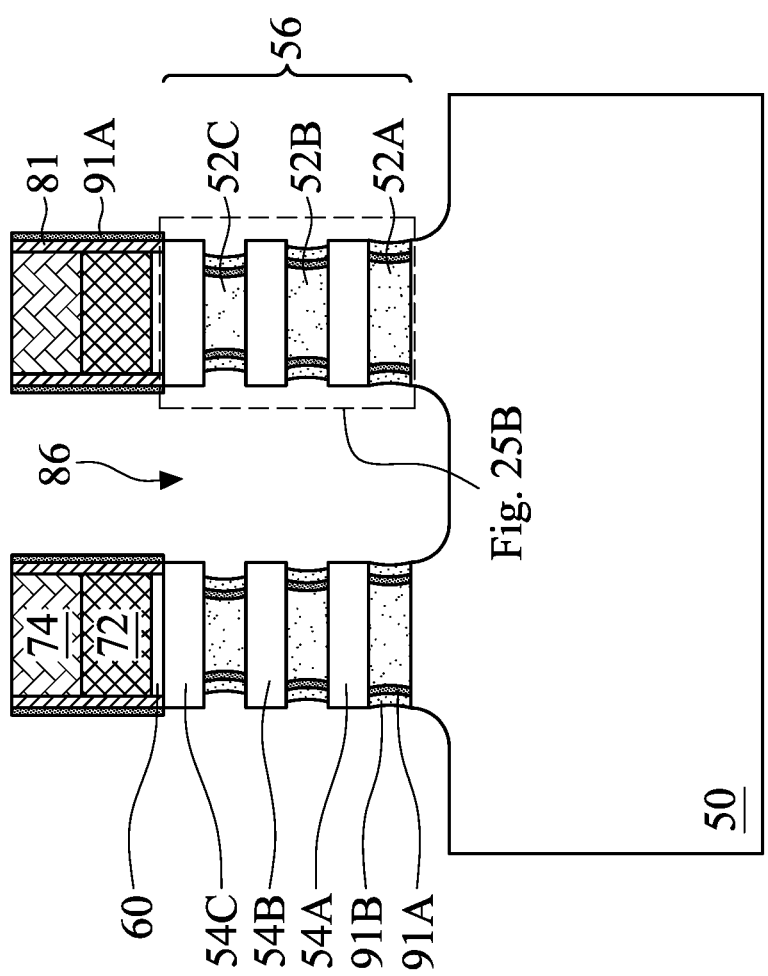

In FIGS. 25A and 25B, the first and second inner spacer layers 90A and 90B may then be etched to form the inner spacers 91, which include inner spacers 91A and 91B. The first and second inner spacer layers 90A and 90B may be etched by an anisotropic etching process, such as RIE, NBE, or the like. The inner spacers 91 may be used to prevent damage to subsequently formed source/drain regions (such as the epitaxial source/drain regions 92, discussed below with respect to FIGS. 26A and 26B) by subsequent etching processes. By including multiple spacer layers in the inner spacer structure, the etching resistance of the inner spacer structure is improved while also lowering the capacitance for the nanostructure device. For example, the material for the first inner spacer layer 90A can be selected for its enhanced etching resistance during the replacement gate process while the material for the second spacer layer 90B can be selected for its low-k value to lower the capacitance of the nanostructure device.

As illustrated in FIG. 25A, some of the inner spacer 91A can remain on the spacers 81 on the sidewalls of the dummy gates 72. This remaining inner spacer 91A can provide extra protection for the sidewalls of replacement gate stacks 100/102 during subsequent processing.

Figure 26B:
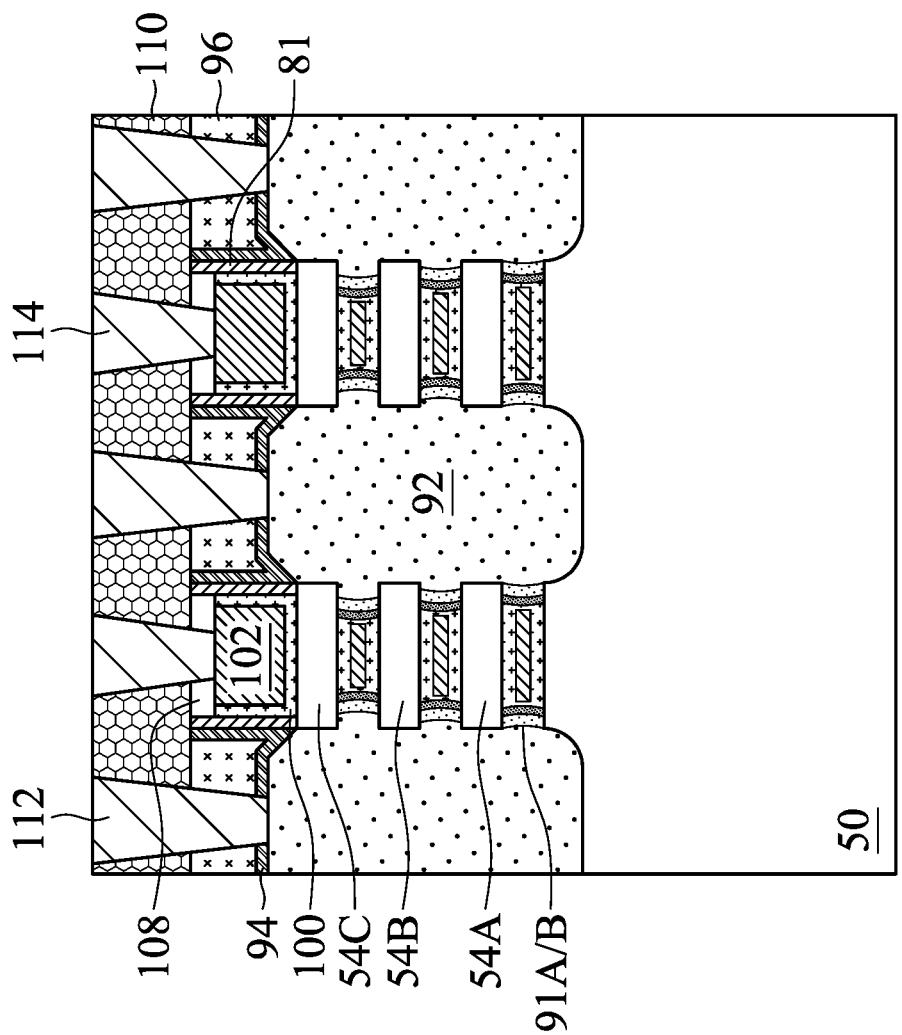
Figure 26A:
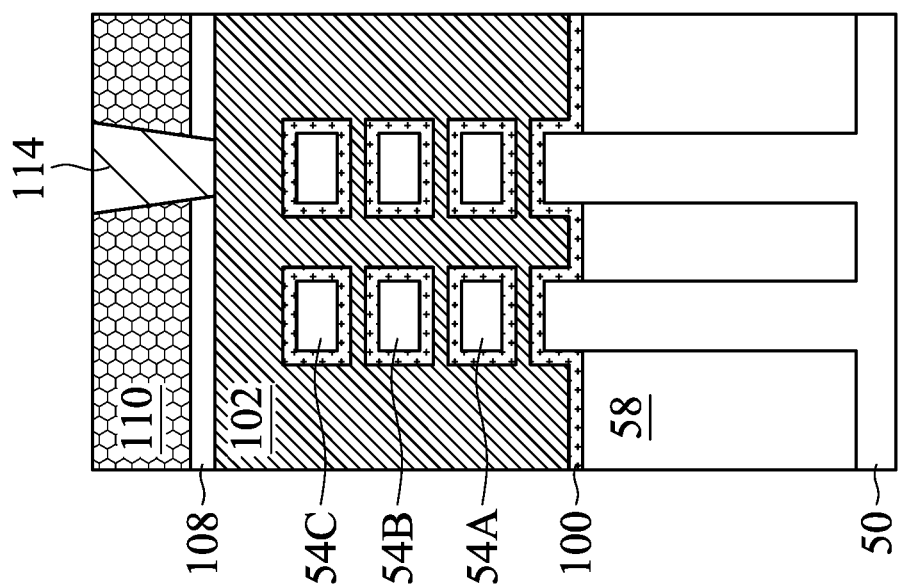

In FIGS. 26A and 26B, subsequent processing is performed on the structure of FIGS. 25A and 25B in the formation of the NSFETs. This subsequent processing is similar to the processing in FIGS. 15A-22B described above and the description is not repeated herein.

Although the embodiment of FIGS. 23 through 26B was illustrated and described separately, its features may be combined with any of the previous embodiments in the disclosure. For example, the first semiconductor layers 52A-52C with substantially planar sidewall surfaces (see, e.g., FIGS. 14A and 14B) may include the two layer inner spacer structure 91A/B.

Embodiments may achieve advantages. In the disclosed embodiments, nanostructures are designed to control the shapes and dimensions of the replacement gate and inner spacer structures. In specific embodiments, the atomic concentration of an element (e.g., Ge) in a semiconductor compound of a sacrificial layer may controlled and varied to control the shape and dimensions of the replacement gate structure. Further, the atomic concentration of an element (e.g., Ge) in a semiconductor compound of a sacrificial layer may controlled and varied to control the length of the channel region of the nanostructure device. By controlling the shape and dimensions of the replacement gate structure and channel length, the electrical properties of the nanostructure device can be improved, and the uniformity of the nanostructure device can be improved. In further embodiments, the inner spacer structure may include multiple spacer layers which can improve the etching resistance of the inner spacer structure while also lowering the capacitance for the nanostructure device.

In an embodiment, a method includes forming a first multi-layer stack over a semiconductor substrate, the first multi-layer stack including a first sacrificial layer over a semiconductor substrate, a first channel layer over the first sacrificial layer, a second sacrificial layer over the first channel layer, and a second channel layer over the second sacrificial layer, the first sacrificial layer having a first atomic concentration of a first semiconductor element, the second sacrificial layer having a second atomic concentration of the first semiconductor element, the second atomic concentration being less than the first atomic concentration. The method also includes patterning the multi-layer stack and the semiconductor substrate to form a first trench. The method also includes forming an isolation region in the first trench. The method also includes forming a first gate stack over the patterned multi-layer stack and isolation region. The method also includes etching the patterned multi-layer stack to form a first recess adjacent the first gate stack, the etching including an isotropic etching process. The method also includes epitaxially growing a first source/drain region in the first recess. The method also includes replacing the first gate stack and the first and second sacrificial layers of the patterned and etched multi-layer stack with a second gate stack, the second gate stack surrounding the etched first channel layer and the etched second channel layer.

Embodiments may include one or more of the following features. The method where the first semiconductor element is germanium. The first sacrificial layer includes silicon germanium. Etching the patterned multi-layer stack to form the first recess etches the first sacrificial layer at a first etch rate and etches the second sacrificial layer at a second etch rate, the second etch rate being less than the first etch rate. The first sacrificial layer has the first atomic concentration of the first semiconductor element throughout the entirety of the first sacrificial layer. Forming the first multi-layer stack over the semiconductor substrate further includes epitaxially growing each of the first sacrificial layer, the first channel layer, the second sacrificial layer, and the second channel layer. Etching the patterned multi-layer stack to form the first recess adjacent the first gate stack further includes anisotropically etching the patterned multi-layer stack and the semiconductor substrate, and after anisotropically etching, isotropically etching the patterned multi-layer stack and the semiconductor substrate, the isotropically etching step recessing sidewalls of the first and second sacrificial layers of the patterned multi-layer stack. After the second gate stack is formed, the inner spacer is between the second gate stack and the first source/drain region. The inner spacer includes multiple spacer layers having different material compositions.

In an embodiment, a method includes forming a first multi-layer fin structure over a semiconductor substrate, forming the first multi-layer fin structure including epitaxially growing a first sacrificial layer over a semiconductor substrate, the first sacrificial layer having a first portion and a second portion, the first portion having a first atomic concentration of a first semiconductor element, the second portion having a second atomic concentration of the first semiconductor element, the second atomic concentration being different than the first atomic concentration. The method also includes epitaxially growing a first channel layer from the first sacrificial layer. The method also includes epitaxially growing a second sacrificial layer from the first channel layer, the second sacrificial layer having a first portion and a second portion, the first portion having a third atomic concentration of the first semiconductor element, the second portion having a fourth atomic concentration of the first semiconductor element, the fourth atomic concentration being different than the third atomic concentration. The method also includes epitaxially growing a second channel layer from the second sacrificial layer. The method also includes and patterning the multi-layer first sacrificial layer, the first channel layer, the second sacrificial layer, the second channel layer, and the semiconductor substrate to form the multi-layer fin structure. The method also includes forming a dummy gate stack over the multi-layer fin structure. The method also includes etching the multi-layer fin structure to form a first recess adjacent the dummy gate stack, the etching including an isotropic etching process. The method also includes epitaxially growing a first source/drain region in the first recess. The method also includes replacing the dummy gate stack and the first and second sacrificial layers of the etched multi-layer fin structure with an active gate stack, the active gate stack surrounding the etched first channel layer and the etched second channel layer.

Embodiments may include one or more of the following features. The method where after etching the multi-layer fin structure, the etched first and second sacrificial layers of the etched multi-layer fin structure have planar sidewalls. After etching the multi-layer fin structure, the etched first and second sacrificial layers of the etched multi-layer fin structure have notched sidewalls. After etching the multi-layer fin structure, the etched first and second sacrificial layers of the etched multi-layer fin structure have tapered sidewalls. The first semiconductor element is germanium. The first portion of the first sacrificial layer is a top portion of the first sacrificial layer, the second portion of the first sacrificial layer being a middle portion of the first sacrificial layer, the top portion and a bottom portion of the first sacrificial layer having a higher atomic concentration of the first semiconductor element than the middle portion of the first sacrificial layer, the middle portion being between the top and bottom portions.

In an embodiment, a semiconductor device includes a first channel region over a semiconductor substrate. The semiconductor device also includes a second channel region over the first channel region. The semiconductor device also includes a first gate stack over the semiconductor substrate and surrounding the first channel region and the second channel region. The semiconductor device also includes a first inner spacer extending from the first channel region to the second channel region and along a sidewall of the first gate stack. The semiconductor device also includes a second inner spacer extending from the first channel region to the second channel region and along a sidewall of the first inner spacer, the second inner spacer having a different material composition than the first inner spacer. The semiconductor device also includes a first source/drain region adjacent the first channel region, the second channel region, and the second inner spacer, the first and second inner spacers being between the first gate stack and the first source/drain region.

Embodiments may include one or more of the following features. The semiconductor device where the first inner spacer physically contacts the first gate stack, and where the second inner spacer physically contacts the first source/drain region. The first inner spacer physically contacts the first gate stack at a concave surface of the first gate stack. The first inner spacer includes SiCN, and where the second inner spacer includes SiN. The first inner spacer and the second inner spacer each extend from a top surface of the first channel region to a bottom surface of the second channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a multi-layer stack over a semiconductor substrate, the multi-layer stack comprising a first sacrificial layer over a semiconductor substrate, a first channel layer over the first sacrificial layer, a second sacrificial layer over the first channel layer, and a second channel layer over the second sacrificial layer, the first sacrificial layer having a first atomic concentration of a first semiconductor element, the second sacrificial layer having a second atomic concentration of the first semiconductor element, the second atomic concentration being less than the first atomic concentration;
    patterning the multi-layer stack and the semiconductor substrate to form a first trench;
    forming an isolation region in the first trench;
    forming a first gate stack over the patterned multi-layer stack and isolation region;
    etching the patterned multi-layer stack to form a first recess adjacent the first gate stack, the etching comprising an isotropic etching process;
    epitaxially growing a first source/drain region in the first recess; and
    replacing the first gate stack and the first and second sacrificial layers of the patterned and etched multi-layer stack with a second gate stack, the second gate stack surrounding each of the etched first channel layer and the etched second channel layer.

2. The method of claim 1, wherein the first semiconductor element is germanium.

3. The method of claim 2, wherein the first sacrificial layer comprises silicon germanium.

4. The method of claim 1, wherein etching the patterned multi-layer stack to form the first recess etches the first sacrificial layer at a first etch rate and etches the second sacrificial layer at a second etch rate, the second etch rate being less than the first etch rate.

5. The method of claim 1, wherein the first sacrificial layer has the first atomic concentration of the first semiconductor element throughout the entirety of the first sacrificial layer.

6. The method of claim 1, wherein forming the first multi-layer stack over the semiconductor substrate further comprises epitaxially growing each of the first sacrificial layer, the first channel layer, the second sacrificial layer, and the second channel layer.

7. The method of claim 1, wherein etching the patterned multi-layer stack to form the first recess adjacent the first gate stack further comprises:
    anisotropically etching the patterned multi-layer stack and the semiconductor substrate; and
    after anisotropically etching, isotropically etching the patterned multi-layer stack and the semiconductor substrate, the isotropically etching step recessing sidewalls of the first and second sacrificial layers of the patterned multi-layer stack.

8. The method of claim 7 further comprising:
    forming an inner spacer on the recessed sidewalls of the first and second sacrificial layers, wherein after the second gate stack is formed, the inner spacer is between the second gate stack and the first source/drain region.

9. The method of claim 8, wherein the inner spacer comprises multiple spacer layers having different material compositions.

10. A method comprising:
    forming a multi-layer fin structure over a semiconductor substrate, forming the multi-layer fin structure comprising:
        epitaxially growing a first sacrificial layer over a semiconductor substrate, the first sacrificial layer having a first portion and a second portion, the first portion having a first atomic concentration of a first semiconductor element, the second portion having a second atomic concentration of the first semiconductor element, the second atomic concentration being different than the first atomic concentration;
        epitaxially growing a first channel layer from the first sacrificial layer;
        epitaxially growing a second sacrificial layer from the first channel layer, the second sacrificial layer having a first portion and a second portion, the first portion having a third atomic concentration of the first semiconductor element, the second portion having a fourth atomic concentration of the first semiconductor element, the fourth atomic concentration being different than the third atomic concentration;
        epitaxially growing a second channel layer from the second sacrificial layer; and
        patterning the first sacrificial layer, the first channel layer, the second sacrificial layer, the second channel layer, and the semiconductor substrate to form the multi-layer fin structure;
    forming a dummy gate stack over the multi-layer fin structure;
    etching the multi-layer fin structure to form a first recess adjacent the dummy gate stack, the etching comprising an isotropic etching process;
    epitaxially growing a first source/drain region in the first recess; and
    replacing the dummy gate stack and the first and second sacrificial layers of the etched multi-layer fin structure with an active gate stack, the active gate stack surrounding the etched first channel layer and the etched second channel layer.

11. The method of claim 10, wherein after etching the multi-layer fin structure, the etched first and second sacrificial layers of the etched multi-layer fin structure have planar sidewalls.

12. The method of claim 10, wherein after etching the multi-layer fin structure, the etched first and second sacrificial layers of the etched multi-layer fin structure have notched sidewalls.

13. The method of claim 10, wherein after etching the multi-layer fin structure, the etched first and second sacrificial layers of the etched multi-layer fin structure have tapered sidewalls.

14. The method of claim 10, wherein the first semiconductor element is germanium.

15. The method of claim 10, wherein the first portion of the first sacrificial layer is a top portion of the first sacrificial layer, the second portion of the first sacrificial layer being a middle portion of the first sacrificial layer, the top portion and a bottom portion of the first sacrificial layer having a higher atomic concentration of the first semiconductor element than the middle portion of the first sacrificial layer, the middle portion being between the top and bottom portions.

16. A method comprising:
    forming a first sacrificial layer over a semiconductor substrate;
    forming a first channel region over the first sacrificial layer, the first sacrificial layer having a first atomic concentration of a first semiconductor element;
    forming a second sacrificial layer over the first channel region;
    forming a second channel region over the second sacrificial layer, the second sacrificial layer having a second atomic concentration of the first semiconductor element, the second atomic concentration being less than the first atomic concentration;
    forming a first gate stack over the semiconductor substrate, the first channel region, the first sacrificial layer, the second sacrificial layer, and the second channel region;
    forming a first inner spacer extending from the first channel region to the second channel region and along a sidewall of the first gate stack;
    forming a second inner spacer extending from the first channel region to the second channel region and along a sidewall of the first inner spacer, the second inner spacer having a different material composition than the first inner spacer, the first inner spacer and the second inner spacer each physically contacting a top surface of the first channel region and a bottom surface of the second channel region;
    epitaxially growing a first source/drain region adjacent the first channel region, the second channel region, and the second inner spacer, the first source/drain region physically contacting the first channel region; and
    replacing the first gate stack and the first and second sacrificial layers with a second gate stack, the second gate stack surrounding each of the first channel region and the second channel region, the first and second inner spacers being between the second gate stack and the first source/drain region.

17. The method of claim 16, wherein the first inner spacer physically contacts the second gate stack, and wherein the second inner spacer physically contacts the first source/drain region.

18. The method of claim 17, wherein the first inner spacer physically contacts the second gate stack at a concave surface of the second gate stack.

19. The method of claim 16, wherein the first inner spacer comprises SiCN, and wherein the second inner spacer comprises SiN.

20. The method of claim 16, wherein the first inner spacer and the second inner spacer each extend from a top surface of the first channel region to a bottom surface of the second channel region.

* * * * *